(12) United States Patent
Yanai et al.

(10) Patent No.: US 11,163,191 B2
(45) Date of Patent: Nov. 2, 2021

(54) ORGANIC ELECTROLUMINESCENCE DISPLAY DEVICE

(71) Applicant: FUJIFILM Corporation, Tokyo (JP)

(72) Inventors: Yujiro Yanai, Kanagawa (JP); Hideki Kaneiwa, Kanagawa (JP); Nobuyuki Akutagawa, Kanagawa (JP); Daisuke Kashiwagi, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/529,160

(22) Filed: Aug. 1, 2019

(65) Prior Publication Data

US 2019/0353956 A1 Nov. 21, 2019

Related U.S. Application Data

(63) Continuation of application No. PCT/JP2018/003595, filed on Feb. 2, 2018.

(30) Foreign Application Priority Data

Feb. 7, 2017 (JP) .............................. JP2017-020536
Jun. 20, 2017 (JP) .............................. JP2017-120240

(51) Int. Cl.
*G02F 1/1335* (2006.01)
*G02B 5/30* (2006.01)
*G02F 1/13363* (2006.01)
*G02F 1/137* (2006.01)
(Continued)

(52) U.S. Cl.
CPC ..... *G02F 1/133528* (2013.01); *G02B 5/3016* (2013.01); *G02B 5/3025* (2013.01);
(Continued)

(58) Field of Classification Search
CPC .............. H01L 51/5293; H01L 27/32; H01L 51/5262–5278; G02B 5/3016; G02B 5/3025
See application file for complete search history.

(56) References Cited

U.S. PATENT DOCUMENTS

2002/0093284 A1 7/2002 Adachi et al.
2014/0375927 A1 12/2014 Ishiguro et al.
(Continued)

FOREIGN PATENT DOCUMENTS

JP 2001-004834 A 1/2001
JP 2001-004995 A 1/2001
(Continued)

OTHER PUBLICATIONS

International Search Report issued in PCT/JP2018/003595 dated Apr. 17, 2018.
(Continued)

*Primary Examiner* — Mariceli Santiago

(74) *Attorney, Agent, or Firm* — Edwards Neils LLC; Jean C. Edwards, Esq.

(57) ABSTRACT

Provided is an organic EL display device in which blue brightness is improved, and an antireflection function in an oblique direction is enhanced. The problem is solved by ensuring that a polarizer, a phase difference layer, a circularly polarized light separating layer, and a light emitting element are provided from a viewing side, an in-plane retardation Re(550) of the phase difference layer is set to 100 to 160 nm, the circularly polarized light separating layer is a cholesteric liquid crystal layer having a selective reflection center wavelength in a range of 425 to 475 nm, and a sum of retardations Rth(550) in a thickness direction of members arranged between the polarizer and the light emitting element is set to −50 to 50 nm.

8 Claims, 3 Drawing Sheets

(51) Int. Cl.
*G09F 9/30* (2006.01)
*H01L 27/32* (2006.01)
*H01L 51/52* (2006.01)
*H05B 33/02* (2006.01)

(52) U.S. Cl.
CPC ...... *G02F 1/13363* (2013.01); *G02F 1/13718* (2013.01); *G09F 9/30* (2013.01); *H01L 27/32* (2013.01); *H01L 51/5271* (2013.01); *H01L 51/5281* (2013.01); *H01L 51/5293* (2013.01); *H05B 33/02* (2013.01); *G02F 1/133541* (2021.01); *G02F 1/133543* (2021.01)

(56) References Cited

U.S. PATENT DOCUMENTS

| | | | | |
|---|---|---|---|---|
| 2015/0378079 | A1* | 12/2015 | Takagi | B29D 11/00644 359/489.07 |
| 2016/0085102 | A1* | 3/2016 | Ohmuro | G02B 5/305 349/61 |
| 2018/0011234 | A1* | 1/2018 | Takahashi | G02B 5/3083 |
| 2020/0013835 | A1* | 1/2020 | Muramatsu | G02B 5/3016 |

FOREIGN PATENT DOCUMENTS

| | | | | |
|---|---|---|---|---|
| JP | 2001004834 | A * | 1/2001 | |
| JP | 2002-215067 | A | 7/2002 | |
| JP | 2003-307622 | A | 10/2003 | |
| JP | 4011292 | B2 | 11/2007 | |
| JP | 2009-259721 | A | 11/2009 | |
| JP | 2013-186132 | A | 9/2013 | |
| JP | 5965675 | B2 | 8/2016 | |
| WO | WO-2016052360 | A1 * | 4/2016 | ........... G02B 5/3041 |
| WO | WO-2016158298 | A1 * | 10/2016 | ........... G02F 1/1335 |

OTHER PUBLICATIONS

Written Opinion issued in PCT/JP2018/003595 dated Apr. 17, 2018.
International Preliminary Report on Patentability completed by WIPO dated Aug. 13, 2019 in connection with International Patent Application No. PCT/JP2018/003595.
Office Action, issued by the Japanese Patent Office dated May 26, 2020, in connection with Japanese Patent Application No. 2018-567400.
Office Action, issued by the Japanese Patent Office dated Dec. 15, 2020, in connection with Japanese Patent Application No. 2018-567400.
Office Action, issued by the Japanese Patent Office dated Jul. 6, 2021, in connection with Japanese Patent Application No. 2018-567400.
Office Action, issued by the State Intellectual Property Office dated Feb. 26, 2021, in connection with Chinese Patent Application No. 201880010599.3.

* cited by examiner

ORGANIC ELECTROLUMINESCENCE DISPLAY DEVICE

CROSS-REFERENCE TO RELATED APPLICATIONS

This application is a Continuation of PCT International Application No. PCT/JP2018/003595 filed on Feb. 2, 2018, which was published under PCT Article 21(2) in Japanese, and which claims priority under 35 U.S.C. § 119(a) to Japanese Patent Application No. 2017-020536 filed on Feb. 7, 2017 and Japanese Patent Application No. 2017-120240 filed on Jun. 20, 2017. The above applications are hereby expressly incorporated by reference, in their entirety, into the present application.

BACKGROUND OF THE INVENTION

1. Field of the Invention

The present invention relates to an organic electroluminescence display device.

2. Description of the Related Art

In recent years, development of organic electro luminescence (EL, (Organic Light Emitting Diode (OLED)) has been accelerated as a display device to replace a liquid crystal display, and a 60-inch class large display has already begun to appear.

In an organic EL display device in the related art, since there is a difference in energy required to emit light of each color, generally, the deterioration of a blue light emitting element is faster than the deterioration of a green or red light emitting element. Therefore, measures have been taken to suppress the amount of light emission in consideration of the lifetime of the blue light emitting element, and the performance of the element originally possessed cannot be fully exhibited.

In addition, since the surface of an organic EL substrate has a high reflectivity, external light is reflected particularly in a bright environment and the contrast is deteriorated. Thus, antireflection film constituted of a polarizer and a λ/4 plate is arranged. However, the light emitted from the organic EL element is absorbed by the polarizer, and the performance cannot be sufficiently exhibited.

In order to solve this problem, it is known to arrange a cholesteric liquid crystal layer formed by fixing a cholesteric liquid crystalline phase between an antireflection film and an organic EL substrate (JP4011292B). However, in this configuration, the antireflection effect is decreased, and although the details will be described later, the antireflection effect in an oblique direction is also decreased.

Moreover, regarding a phase difference film which prevents reflection in an oblique direction, for example, a configuration disclosed in JP5965675B is known, but there is no description about use in combination with a cholesteric liquid crystal layer.

SUMMARY OF THE INVENTION

An object of the present invention is to provide an organic EL display device in which blue brightness is improved and an antireflection function in an oblique direction is enhanced.

Means for achieving the above object is as follows.

[1] An organic electroluminescence display device comprising, at least: a polarizer; a phase difference layer; a circularly polarized light separating layer; and an organic electroluminescence light emitting element,
in which the polarizer, the phase difference layer, the circularly polarized light separating layer, and the organic electroluminescence light emitting element are arranged in this order from a viewing side, an in-plane retardation Re(550) of the phase difference layer is 100 to 160 nm, the circularly polarized light separating layer is a cholesteric liquid crystal layer having a selective reflection center wavelength in a range of 425 to 475 nm, and a sum of retardations Rth(550) in a thickness direction of members having an optical function, which are arranged between the polarizer and the organic electroluminescence light emitting element, is −50 to 50 nm.

[2] The organic electroluminescence display device according to [1], in which the number of spiral turns of the cholesteric liquid crystal layer is 4 to 8.

[3] The organic electroluminescence display device according to [1] or [2], further comprising: a C-plate arranged between the polarizer and the organic electroluminescence light emitting element, in which the number of spiral turns of the cholesteric liquid crystal layer is 6 to 8.

[4] The organic electroluminescence display device according to [1] or [2], in which the phase difference layer is an A-plate, and the number of spiral turns of the cholesteric liquid crystal layer is 4 or 5.

[5] The organic electroluminescence display device according to [1] or [2], in which the phase difference layer is a B-plate, and the number of spiral turns of the cholesteric liquid crystal layer is 6 to 8.

[6] The organic electroluminescence display device according to any one of [1] to [5], in which the phase difference layer exhibits reciprocal wavelength dispersibility.

[7] The organic electroluminescence display device according to any one of [1] to [6], in which the circularly polarized light separating layer is a cholesteric liquid crystal layer formed of a disk-like liquid crystal compound.

[8] The organic electroluminescence display device according to any one of [1] to [6], in which the circularly polarized light separating layer is a cholesteric liquid crystal layer formed of a rod-like liquid crystal compound.

According to the present invention, it is possible to provide an organic EL display device in which blue brightness is improved and an antireflection function in an oblique direction is enhanced.

DESCRIPTION OF THE PREFERRED EMBODIMENTS

Hereinafter, an organic electroluminescence display device (organic EL display device) according to an embodiment of the present invention will be described in detail.

In the present specification, Re(λ) and Rth(λ) represent an in-plane retardation and a retardation in a thickness direction at a wavelength of λ, respectively. Unless specified otherwise, the wavelength λ, is 550 nm.

In the present specification, Re(λ) and Rth(λ) are values measured at a wavelength of λ using AxoScan (manufactured by Axometrics Inc.). By inputting an average refractive index ((nx+ny+nz)/3) and a film thickness (d (μm)) to AxoScan, the following expressions can be calculated.

Slow axis direction (°)

$$Re(\lambda)=R0(\lambda)$$

$$Rth(\lambda)=((nx+ny)/2-nz)d$$

R0(λ) is expressed as a numerical value calculated by AxoScan and represents Re(λ).

In the present specification, visible light refers to light which can be observed by human eyes among electromagnetic waves and refers to light in a wavelength range of 380 nm to 780 nm. Invisible light refers to light in a wavelength range of shorter than 380 nm or longer than 780 nm.

In addition, although not limited thereto, in visible light, light in a wavelength range of 420 to 490 nm is blue light, light in a wavelength range of 495 to 570 nm is green light, and light in a wavelength range of 620 to 750 nm is a red light.

Figure 1:
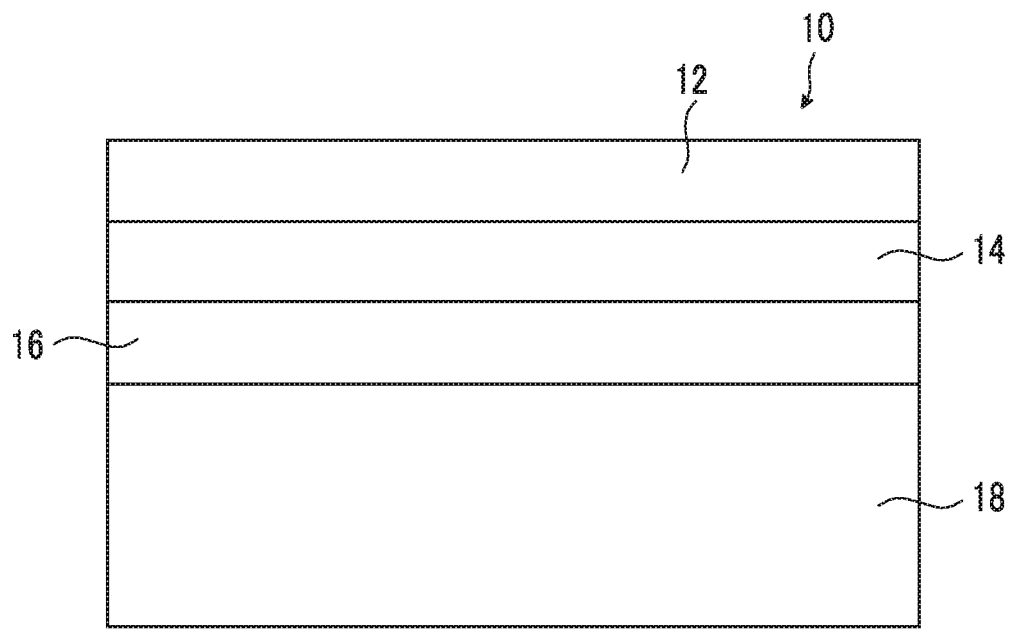
FIG. 1 is a conceptual view showing an example of an organic EL display device according to the present invention.

FIG. 1 is a conceptual view showing an example of an organic electroluminescence display device (organic EL display device) according to an embodiment of the present invention.

An organic EL display device 10 according to the embodiment of the present invention shown in FIG. 1 has a polarizer 12, a phase difference layer 14, a circularly polarized light separating layer 16, and an organic electroluminescence light emitting element (organic EL light emitting element) 18 in this order from a viewing side.

In the present invention, in addition to the polarizer 12 and the phase difference layer 14, the circularly polarized light separating layer 16 is provided and by using a cholesteric liquid crystal layer which reflects only blue light as the circularly polarized light separating layer 16, the brightness of blue light can be increased and reflection can be suppressed. Particularly, reflection in an oblique direction can be suppressed.

The reason why the reflection, particularly the reflection in the oblique direction can be suppressed is as follows.

Although described later, the circularly polarized light separating layer 16 is a cholesteric liquid crystal layer. Specifically, the cholesteric liquid crystal layer is a layer having a cholesteric liquid crystal structure formed by fixing a cholesteric liquid crystalline phase. Such a circularly polarized light separating layer 16 substantially becomes a C-plate since the chirality of the cholesteric liquid crystal is averaged for light outside the reflection range. In addition, since the reflection range of the cholesteric liquid crystal in the oblique direction is shifted to a short wavelength side, a cholesteric liquid crystal layer which reflects blue light at the front functions as a C-plate in the visible range in the oblique direction. On the other hand, since a cholesteric liquid crystal which reflects green light or red light at the front is tinted even in the oblique direction and the antireflection effect is reduced, the cholesteric liquid crystal layer cannot be used.

In addition, it is possible to suppress a reduction in antireflection effect in the front direction as much as possible by reflecting only blue light in the front direction. This is because the influence on brightness is small.

In the present invention, the circularly polarized light separating layer 16 having a cholesteric liquid crystal layer with blue light as a selective reflection center wavelength is arranged between the polarizer 12 and the phase difference layer 14, and the organic EL light emitting element 18 (organic EL light emitting element substrate). Here, a combination of using a +A-plate or a B-plate of which Rth(550) has a positive value as the phase difference layer 14, and a cholesteric liquid crystal layer formed of a disk-like liquid crystal compound as the cholesteric liquid crystal layer of the circularly polarized light separating layer 16 is more preferable. This is because the cholesteric liquid crystal layer formed of a disk-like liquid crystal compound functions as a +C-plate outside the reflection range. Further, the phase difference layer 14 (λ/4 film) preferably has reciprocal wavelength dispersibility.

Alternatively, a combination of using a −A-plate or a B-plate of which Rth(550) has a negative value as the phase difference layer 14 and a cholesteric liquid crystal layer formed of a rod-like liquid crystal compound as the cholesteric liquid crystal layer of the circularly polarized light separating layer 16 is also preferable. This is because the cholesteric liquid crystal layer formed of a rod-like liquid crystal compound functions as a −C-plate outside the reflection range.

[Polarizer 12]

The polarizer 12 may be a linearly polarizing plate having a transmission axis (polarization axis) in one direction and having a function of converting natural light into a specific linearly polarized light. As the polarizer 12, for example, various polarizers used for constituting antireflection layers can be used in various organic EL display devices.

Accordingly, for example, as the polarizer 12, any of an iodine-based polarizing plate, a dye-based polarizing plate using a dichroic dye, or a polyene-based polarizing plate can be used. The iodine-based polarizing plate and the dye-based polarizing plate are generally prepared by adsorbing iodine or a dichroic dye into polyvinyl alcohol and stretching the polyvinyl alcohol.

The direction of the slow axis of the phase difference layer 14 described later is adjusted depending on the direction of circularly polarized light reflected by the circularly polarized light separating layer 16, so that the direction of linearly polarized light emitted by itself coincides with the transmission axis of the polarizer 12. Typically, the intersecting angle formed between the slow axis of the phase difference layer 14 and the transmission axis of the polarizer 12 is set to 45°±1°.

However, in the present invention, the intersecting angle formed between the slow axis of the phase difference layer 14 and the transmission axis of the polarizer 12 may be outside a range of 45°±1°. For example, the intersecting angle formed between the slow axis of the phase difference layer 14 and the transmission axis of the polarizer 12 may he set to 38° to 52°. By setting the intersecting angle formed between the slow axis of the phase difference layer 14 and the transmission axis of the polarizer 12 to be outside the range of 45°±1°, particularly, to be in the above range, the reflection of green light and red light can be increased in a range causing no problem while the reflection of blue light is suppressed, and further excellent reflection tint, particularly, reflection tint (viewing angle properties) in a case of being observed in an oblique direction can he achieved while the antireflection function is maintained. This effect is more suitably obtained in a case where the phase difference layer 14 has reciprocal wavelength dispersibility.

[Phase Difference Layer 14]

(Ranges of Retardation Re and Rth)

Regarding the in-plane retardation (Re(λ) of the phase difference layer 14 in the present invention, from the viewpoint of antireflection, the range of Re(550) is 100 to 160 nm, preferably 110 to 155 nm, and more preferably 120 to 150 nm.

In addition, in consideration of combination with the cholesteric liquid crystal layer, from the viewpoint of antireflection in the oblique direction, the absolute value of Rth(550) of the phase difference layer 14 which is a retardation in the thickness direction is preferably 50 to 200 nm, more preferably 55 to 180 nm, and even more preferably 60 to 160 nm.

The phase difference layer 14 may be a single layer or a laminate of two or more layers. The phase difference layer 14 is preferably a laminate of two or more layers.

In addition, as necessary, the phase difference layer 14 may be formed on a substrate such as a glass substrate and a resin film.

In a case where the phase difference layer 14 is formed on a substrate such as a glass substrate and a resin film, Rth(550) of the phase difference layer 14 refers to a total Rth(550) of Rth(550) of the phase difference layer 14 itself and Rth(550) of the substrate. Regarding this point, the same applies to all light transmissive layers (members having an optical function), such a C-plate and a circularly polarized light separating layer described later, which are provided between the polarizer 12 and the organic EL light emitting element 18.

The phase difference layer 14 is preferably a λ/4 film (λ/4 plate). Particularly, the λ/4 film is preferably one or more phase difference films including at least one of a phase difference film (optically substantially uniaxial or biaxial) or a liquid crystal compound formed by polymerizing a liquid crystal monomer exhibiting a nematic liquid crystal layer or a smectic liquid crystal layer (such as a disk-like liquid crystal compound or a rod-like liquid crystal compound). Among these, the phase difference layer 14 is more preferably a λ/4 film formed using a polymerizable liquid crystal compound.

With regard to the phase difference film, it is possible to select a phase difference film that is stretched in a transport direction, is stretched in a direction perpendicular to the transport direction, or is stretched in a direction oblique to the transport direction at the time of film production. In consideration of productivity, a phase difference film obtained by stretching a cyclic polyolefin resin (norbornene-based resin) or the like capable of preparing an optical sheet member by a so-called roll-to-roll process in the oblique direction, or a film having a layer obtained by subjecting a transparent film to an alignment treatment, and aligning a liquid crystal compound on the treated surface in a direction oblique to the transport direction at the time of film production is preferably used.

As described above, the phase difference layer 14 may be a laminate of two or more layers (a laminate of two or more phase difference layers).

In the present invention, in a ease where the phase difference layer 14 is a laminate of two or more layers, the laminate is handled as one phase difference layer 14.

Accordingly, in a case where the phase difference layer 14 is a laminate of two or more layers, the in-plane retardation (Re(550)) and the retardation in the thickness direction (Rth(550)) are Re(550) and Rth(550) in a case where the laminate is considered as one phase difference layer 14.

In the present invention, in the case where the phase difference layer 14 is a laminate, Re(λ) and Rth(λ) are measured by the following method.

Re(λ) is measured by making light having a wavelength of λ nm incident into the phase difference layer 14 (film) in the normal direction of the film using KOBRA 21 ADH or WR (manufactured by Oji Scientific Instruments Co., Ltd.). In the selection of the measurement wavelength of λ nm, a wavelength selective filter can be manually replaced, or, the measured value can be converted by using a program or the like.

On the other hand, Rth(λ) is a sum of Rth(λ) of the individual layers constituting the phase difference layer 14. Accordingly, in a case where Rth(λ) of each layer constituting the phase difference layer 14 is already known, Rth(λ) of the phase difference layer 14 is obtained by calculating the sum pf Rth(λ) of each layer. In a case where the phase difference layer 14 has a support having an optical function or the like, this sum includes Rth(λ) of the support or the like.

In a case where Rth(λ) of each layer constituting the phase difference layer is unknown, a total of six points of Re(λ) are measured by making light having a wavelength of λ nm incident into the phase difference layer from each of the inclined directions at an angle increasing in 10° step increments up to 50° in one direction from the normal direction with respect to the normal direction of the phase difference layer 14 by taking any in-plane direction of the phase difference layer 14 as an inclined axis (rotational axis), and Rth(λ) is calculated by KOBRA 21 ADH or WR based on the retardation value measured, the assumed value of the average refractive index, and the film thickness value inputted.

As long as the sum (total) of Re(550) of the phase difference layer 14 which is a laminate is 100 to 160 nm, and Rth(550) of members having an optical function, which are provided between the polarizer 12 and the organic EL light emitting element 18, can be set to −50 to 50 nm, various known layers can be used.

For example, the phase difference layer 14 which is a laminate is exemplified as a phase difference layer 14 that includes a plurality of phase difference layers, preferably has a first phase difference layer and a second phase difference layer, and Re(450), Re(550), and Re(650) measured at wavelengths of 450 nm, 550 nm, and 650 nm satisfy Expressions (1) to (3).

$$100 \leq Re(550) \leq 180 \text{ nm} \qquad \text{Expression (1)}$$

$$0.70 \leq Re(450)/Re(550) \leq 0.90 \qquad \text{Expression (2)}$$

$$1.05 \leq Re(650)/Re(550) \leq 1.30 \qquad \text{Expression (3)}$$

As the first phase difference layer and the second phase difference layer, a λ/4 layer and a λ/2 layer are exemplified.

Any of the λ/4 layer or the λ/2 layer may be the first phase difference layer and the second phase difference layer, hut the λ/2 layer is preferably arranged on the side close to the polarizer 12.

In a case where the phase difference layer 14 is a laminate of a λ/4 layer and a λ/2 layer, the in-plane retardation Re(550) of the λ/4 layer at a wavelength of 550 nm preferably satisfies "100 nm≤Re(550)≤180 nm". In this range, when combined with the λ/2 layer, the light leakage of reflected light can he further reduced and thus this range is preferable.

In addition, in the case where the phase difference layer 14 is the laminate of the λ/4 layer and the λ/2 layer, the in-plane retardation Re1 of the λ/2 layer is preferably set to he substantially two times the in-plane retardation Re2 of the λ/4 layer. Here, the "retardation is substantially two times" indicates that "Re1=2×Re2±50 nm".

(A-Plate, B-Plate, and C-Plate)

In the present specification, the definition of an A-plate is as follows.

There are two kinds of A-plates; a +A-plate (positive A-plate) and a −A-plate (negative A-plate). In a case where the refractive index in the in-plane slow axis direction of the film (the direction in which the refractive index becomes the maximum in the plane) is nx, the refractive index in an in-plane direction orthogonal to the in-plane slow axis is ny, and the refractive index in the thickness direction is nz, the +A-plate satisfies the relationship of Expression (A1), and the −A-plate satisfies the relationship of Expression (A2). Rth of the +A-plate has a positive value and Rth of the −A-plate has a negative value.

$$nx > ny \cong nz \quad \text{Expression (A1)}$$

$$ny < nx \cong nz \quad \text{Expression (A2)}$$

The term "≅" includes not only a case in which both are completely the same but also a case in which both are substantially the same. Regarding the term "substantially the same", for example, a case where (ny−nz)×d (where d represents a film thickness) is −10 to 10 nm, and preferably −5 to 5 nm is also included in the term "ny≅nz", and a case where (nx−nz)×d is −10 to 10 nm and preferably −5 to 5 um is also included in the term "nx≅nz".

All values of nx, ny, and nz of a B-plate are different and there are two kinds of B-plates; a B-plate having a negative Rth value satisfying the relationship of Expression (B1) and a B-plate having a positive Rth value satisfying the relationship of Expression (B2).

$$(nx+ny)/2 > nz \quad \text{Expression (B1)}$$

$$(nx+ny)/2 < nz \quad \text{Expression (B2)}$$

There are two kinds of C-plates; a +C-plate (positive C-plate) and a −C-plate (negative C-plate). The +C-plate satisfies the relationship of Expression (C1) and the −C-plate satisfies the relationship of Expression (C2). Rth of the +C-plate has a negative value and Rth of the −C-plate has a positive value.

$$nz > nx \cong ny \quad \text{Expression (C1)}$$

$$nz < nx \cong ny \quad \text{Expression (C2)}$$

The term "≅" includes not only a case in which both are completely the same but also a case in which both are substantially the same. Regarding the term "substantially the same", for example, a case where (nx−ny)×d (where d represents a film thickness) is 0 to 10 nm and preferably 0 to 5 nm is also included in the term "nx≅ny".

(Reciprocal Wavelength Dispersibility)

In terms of reducing the tint of reflection, Re of the phase difference layer 14 preferably exhibits reciprocal wavelength dispersibility. The reciprocal wavelength dispersibility refers to a relationship of Re(450)<Re(550)<Re(650).

Specifically, the ratio of Re(450)/Re(550) is preferably in a range of 0.8 to 0.9 and the ratio of Re(650)/Re(550) is preferably in a range of 1.03 to 1.25.

In addition, with regard to the C-plate described later, "the C-plate exhibits reciprocal wavelength dispersibility" refers to a relationship of Rth(450)<Rth(550)<Rth(650).

(Optical Properties of Phase Difference Layer)

The phase difference layer 14 may be optically uniaxial or biaxial.

Since the absolute value of Rth(550) is increased by using the biaxial phase difference layer 14 (B-plate), the number of spiral turns of the cholesteric liquid crystal in the circularly polarized light separating layer 16 described later is increased and thus the brightness of blue light can be increased (the irradiation amount of blue light (the amount of blue light) is increased).

On the other hand, in a case of using the biaxial phase difference layer 14, an antireflection function in the oblique direction is reduced due to an increase in the absolute value of Rth(550), and further, the color balance of the display may be lost.

Accordingly, whether the phase difference layer 14 is uniaxial or biaxial may be appropriately selected according to the properties required for the organic EL display device. According to the investigation of the present inventors, from the viewpoint of the overall balance of the brightness of blue light, the oblique antireflection properties, and the color balance of the display, the phase difference layer 14 is preferably uniaxial (A-plate).

[Circularly Polarized Light Separating Layer 16]

As described above, the circularly polarized light separating layer 16 is a layer having a cholesteric liquid crystal structure, which is formed by fixing a cholesteric liquid crystalline phase. In the present invention, "layer having a cholesteric liquid crystal structure, which is formed by fixing a cholesteric liquid crystalline phase" is also referred to as a "cholesteric liquid crystal layer".

The circularly polarized light separating layer 16 may be formed on a substrate such as a glass substrate and a resin film as necessary.

(Cholesteric Liquid Crystal Structure)

A cholesteric structure is known to exhibit selective reflectivity at a particular wavelength. The selective reflection center wavelength λ (reflection center wavelength center wavelength λ of selective reflection) depends on the pitch P of the spiral structure (=period of spiral) in the cholesteric structure, and follows the relationship of the average refractive index n of the cholesteric liquid crystal and λ=n×P. Therefore, the reflection center wavelength can be adjusted by adjusting this pitch of the spiral structure. Since the pitch of the cholesteric structure depends on the kind of the chiral agent used together with a polymerizable liquid crystal compound at the time of forming the circularly polarized light separating layer 16, or the concentration of addition of the chiral agent, a desired pitch can be obtained by adjusting these.

In regard to the adjustment of the pitch, a detailed description is given in Fuji Film Research & Development, No. 50 (2005), p. 60-63. In regard to the method for measuring the sense or pitch of a spiral, the methods described in "Ekisho Kagaku Jikken Nyumon (Introduction to Experiments in Liquid Crystal Chemistry)", edited by Japanese Liquid Crystal Society published by Sigma Shuppan K. K., 2007, p. 46; and "Ekisho Benran (Handbook of Liquid Crystals)", Editorial Committee for the Handbook of Liquid Crystals, Manizen, Inc., p. 196, can be used.

(Selective reflection Center Wavelength)

In the present invention, the selective reflection center wavelength and the half-width of the circularly polarized light separating layer 16 can be obtained as follows.

In a case where the transmission spectrum of the circularly polarized light separating layer is measured using a spectrophotometer UV3150 (manufactured by Shimadzu Corporation), decreasing peak of transmittance is observed in a selective reflection range. In a case where, in two wavelengths which become transmittance of ½ of height of the highest peak, a value of a wavelength on a short wavelength side is set to λ1 nm, and a value of a wavelength on a long wavelength side is set to λ2 nm, the selective reflection center wavelength and a half-width Δλ can be represented by the following expressions.

Selective reflection center wavelength=(λ1+λ2)/2

Half-width=(λ2−λ1)

Here, in the present invention, the half-width of the selective reflection by the circularly polarized light separating layer 16 (cholesteric liquid crystal layer) is not limited but is preferably narrow. The half-width of the selective reflection by the circularly polarized light separating layer 16 is preferably 20 to 100 nm, more preferably 30 to 60 nm, and even more preferably 35 to 50 nm.

By setting the half-width of the selective reflection by the circularly polarized light separating layer 16 to be in the above range, the effect of improving the brightness of blue light can be suitably obtained and by suppressing the reflected glare of external light (a so-called halo phenomenon) by suppressing multiple reflection caused in the circularly polarized light separating layer 16 in the organic EL display device 10, a further excellent display can be achieved.

The cholesteric liquid crystal structure gives a striped pattern of bright parts and dark parts in a cross-sectional image of the circularly polarized light separating layer 16 as observed by a scanning electron microscope (SEM). Two repeated sets of the bright part and the dark part (three bright parts and two dark parts) correspond to one pitch of the spiral (one spiral turn). From this, the number of spiral turns of the cholesteric liquid crystal layer can be measured from a SEM cross-sectional view. The normal lines to the various lines of the striped pattern become the direction of the spiral axis.

(Method for Preparing Cholesteric Structure)

The cholesteric structure can be obtained by fixing a cholesteric liquid crystalline phase. The structure in which a cholesteric liquid crystalline phase is fixed may be a structure in which the alignment of the liquid crystal compound that forms the cholesteric liquid crystalline phase is retained, and typically, the structure may be a structure in which a polymerizable liquid crystal compound is brought into an aligned state of the cholesteric liquid crystalline phase and then is polymerized and cured by ultraviolet irradiation, heating or the like, and a layer lacking fluidity is formed and simultaneously changed into a state that is free of any factor causing a change in the aligned state by an external field or an external three. Meanwhile, in the structure obtained by fixing the cholesteric, liquid crystalline phase, it is sufficient that the optical properties of the cholesteric liquid crystalline phase are retained, and the liquid crystal compound may not exhibit liquid crystallinity any longer. For example, the polymerizable liquid crystal compound may he macromolecularized by a curing reaction and thereby may no longer have liquid crystallinity.

The material used for forming the cholesteric structure may be a liquid crystal composition including a liquid crystal compound. The liquid crystal compound is preferably a polymerizable liquid crystal compound.

The liquid crystal composition including a polymerizable liquid crystal compound further includes a surfactant, a chiral agent, a polymerization initiator, and the like. Examples of the surfactant, the chiral agent, and the polymerization initiator include compounds described in JP2016-197219A.

The polymerizable liquid crystal compound may be a rod-like liquid crystal compound or a disk-like liquid crystal compound.

Examples of the polymerizable group include an acryloyl group, a methacryloyl group, an epoxy group, and a vinyl group. The alignment of a liquid crystal compound can he fixed by curing the polymerizable liquid crystal compound. The liquid crystal compound having a polymerizable group is preferably a monomer or a relatively low molecular weight liquid crystal compound having a degree of polymerization of less than 100 is preferable.

(Disk-Like Liquid Crystal Compound)

Examples of the disk-like liquid crystal compound include compounds described in JP2007-108732A, JP2010-244038A, JP2013-195630A, JP1998-307208A (JP-H10-307208A), and JP2000-171637A. Generally, in JP2013-195630A, it is described that the disk-like liquid crystal compound is preferably a compound having a triphenylene structure. On the other hand, since a disk-like liquid crystal compound having a tri-substituted benzene structure has a higher An than a disk-like liquid crystal compound having a triphenylene structure, and the reflection wavelength range can he widened, the compound can be appropriately selected as necessary.

(Rod-Like Liquid Crystal Compound)

As the rod-like liquid crystal compound, azomethines, azoxys, cyanobiphenyls, cyanophenyl esters, benzoic acid esters, cyclohexanecarboxylic acid phenyl esters, cyanophenylcyclohexanes, cyano-substituted phenylpyrimidines, alkoxy-substituted phenylpyrimidines, phenyldioxanes, tolanes, and alkenylcyclohexylbenzonitriles are preferably used.

As the rod-like liquid crystal compound which is a polymerizable liquid crystal compound, compounds described in Makromol. Chem., Vol. 190, p. 2255 (1989), Advanced Materials, Vol. 5, p. 107 (1993), U.S. Pat. Nos. 4,683,327A, 5,622,648A, 5,770,107A, WO95/022586A, WO95/024455A, WO97/000600A, WO98/023580A, WO98/052905A, JP1989-272551A (JP-H01-272551 A), JP1994-016616A (JP-H06-016616A), JP1995-110469A (JP-H07-110469A), JP1999-080081A (JP-H11-080081A), and JP2001-064627A. Further, as the rod-like liquid crystal compound, for example, compounds described in JP1999-513019.A (JP-H11-513019A) and JP2007-279688A can be preferably used.

(Number of Turns of Spiral of Cholesteric Liquid Crystal (Number of Spiral Pitches))

In the circularly polarized light separating layer 16 which is a cholesteric liquid crystal layer, the reflectivity of blue light is affected by the number of spiral turns of the cholesteric liquid crystal layer. Specifically, as the number of spiral turns of the cholesteric liquid crystal layer increases, the reflectivity of blue light increases, and thus the brightness of blue light can be increased.

On the other hand, in the circularly polarized light separating layer 16, as the number of spiral turns of the cholesteric liquid crystal layer increases, the absolute value of Rth(550) increases.

As will be described later, in the organic EL display device according to the embodiment of the present invention, the sum (total) of Rth(550) of members having an optical function, which are provided between the polarizer 12 and the organic EL light emitting element 18, is −50 to 50 nm.

Accordingly, the number of spiral turns of the cholesteric liquid crystal layer in the circularly polarized light separating layer 16 may be appropriately set according to the brightness of blue light required and Rth(550) of members having an optical function, which are provided between the polarizer 12 and the organic EL light emitting element 18.

From the viewpoint of while maintaining the blue light reflectivity of the cholesteric liquid crystal layer, optimizing Rth(550) of the cholesteric liquid crystal layer, the number of spiral turns of the cholesteric liquid crystal layer is preferably 4 to 8 pitches (4 to 8).

The control of the number of spiral turns of the cholesteric liquid crystal layer can be performed by controlling the film thickness of the circularly polarized light separating layer 16.

In consideration of this point, the film thickness of the circularly polarized light separating layer 16 is preferably 1.0 to 2.5 μm and more preferably 1.2 to 2.3 μm.

Regarding the number of spiral turns of the cholesteric liquid crystal layer, in a case where the phase difference layer 14 (the λ/4 film) is a uniaxial phase difference layer (for example, A-plate), and only the phase difference layer 14 and the circularly polarized light separating layer 16 are provided between the polarizer 12 and the organic EL light emitting element 18 as in the organic EL display device 10 shown in the drawing as members having an optical function, the number of spiral turns of the cholesteric liquid crystal layer is preferably 4 or 5.

In the present invention, the "member having an optical function" indicates, as an example, a member that satisfies at least one of a value of Re of 5 nm or more or an absolute value of Rth of 10 nm or more.

In addition, in a case where the phase difference layer 14 (λ/4 film) is a biaxial phase difference layer (for example, B-plate), and only the phase difference layer 14 and the circularly polarized light separating layer 16 are provided between the polarizer 12 and the organic EL light emitting element 18 as in the organic EL display device 10 shown in the drawing as members having an optical function, the number of spiral turns of the cholesteric liquid crystal layer is preferably 6 to 8.

In addition, as described later, in a case of using a C-plate, from the viewpoint of being capable of further increasing the reflectivity of blue light, the number of spiral turns of the cholesteric liquid crystal layer is preferably 6 to 8 and more preferably 7 to 8.

[Preferable Combination of Phase Difference Layer 14 and Circularly Polarized Light Separating Layer 16]

(Sum of Rth)

In the organic EL display device according to the embodiment of the present invention, the sum (total) of Rth(550) of members having an optical function, which are provided between the polarizer 12 and the organic EL light emitting element 18, is −50 to 50 nm (±50 nm). In other words, in the organic EL display device according to the embodiment of the present invention, the absolute value of the sum (total) of Rth(550) of members having an optical function, which are provided between the polarizer 12 and the organic EL light emitting element 18, is 50 nm or less.

From the viewpoint of enhancing an antireflection function in the oblique direction, the sum (total) of Rth(550) of members having an optical function, which are provided between the polarizer 12 and the organic EL light emitting element 18, is preferably −45 to 45 nm, more preferably −40 to 40 nm, even more preferably −20 to 20 nm, and particularly preferably −10 to 10 nm.

Particularly, in a case where a C-plate is provided between the polarizer 12 and the organic EL light emitting element 18, the sum (total) of Rth(550) of members having an optical function, which are provided between the polarizer 12 and the organic EL light emitting element 18, is preferably −20 to 20 nm and more preferably −10 to 10 nm.

That is, in the organic EL display device 10 shown in FIG. 1, the sum (total) of Rth(550) of the phase difference layer 14 and Rth(550) of the circularly polarized light separating layer 16 is −50 to 50 nm.

Figure 3:
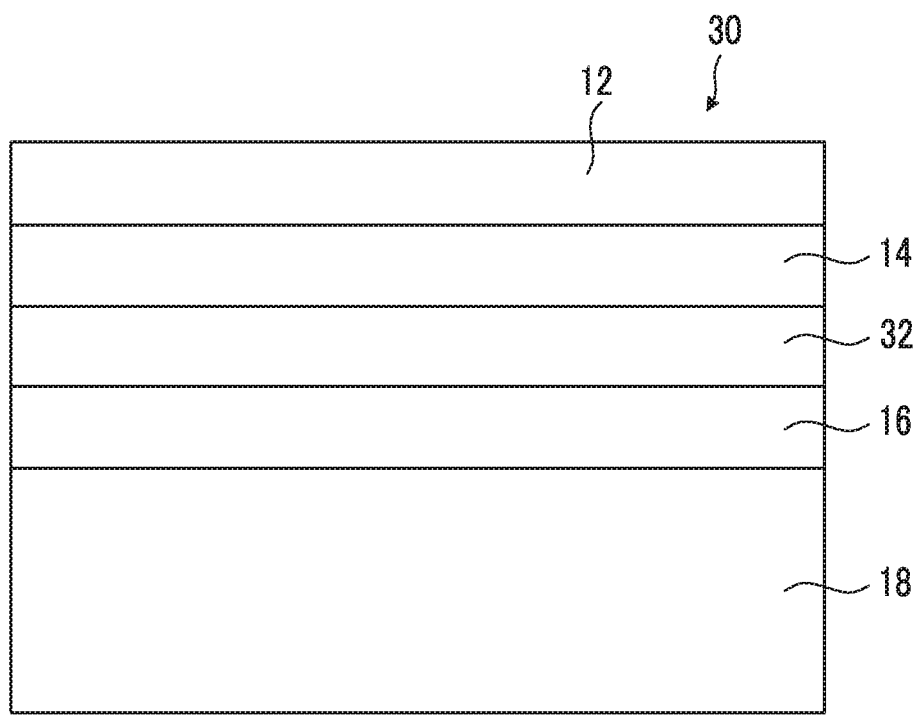
FIG. 3 is a conceptual view showing another example of the organic EL display device according to the present invention.

In addition, in the configuration of an organic EL display device 30 having a C-plate 32 shown in FIG. 3, the sum (total) of Rth(550) of the phase difference layer 14, Rth(550) of the circularly polarized light separating layer 16, and Rth(550) of the C-plate 32 is −50 to 50 nm.

Since the organic EL display device according to the embodiment of the present invention has such a configuration, a good antireflection function in the oblique direction is realized.

Accordingly, as one preferable combination of the phase difference layer 14 and the circularly polarized light separating layer 16, as described above, a combination of a +A-plate having reciprocal wavelength dispersibility or a B-plate having reciprocal wavelength dispersibility, of which Rth(550) has a positive value, and the circularly polarized light separating layer 16 (cholesteric liquid crystal layer) that substantially functions as a +C-plate in the visible light range, has a negative Rth(550) value, and is formed of a disk-like liquid crystal compound is exemplified.

In addition, as another example of a preferable combination of the phase difference layer 14 and the circularly polarized light separating layer 16, as described above, a combination of a −A-plate having forward wavelength dispersibility or a B-plate having forward wavelength dispersibility, of which Rth(550) has a negative value, and a circularly polarized light separating layer 16 (cholesteric liquid crystal layer) that substantially functions as a −C-plate in the visible light range, has a positive Rth(550) value, and is formed of a rod-like liquid crystal compound is exemplified.

(Organic EL Light Emitting Element 18)

The organic EL light emitting element 18 displays an image by organic EL.

As an example, the organic EL light emitting element 18 is a known organic EL light emitting element constituting an organic EL light emitting device (OLED), such as an organic. EL display or an organic illumination device, having a transparent electrode layer (thin film transistor (TFT)), a hole injection layer, a hole transport layer, an organic EL light emitting layer, a hole blocking layer, an electron transport layer, an electron injection layer, a cathode, and the like.

In addition, as the organic EL light emitting element 18, one obtained, by removing an antireflection layer (antireflection film) from a known organic EL display, an organic EL display not having an antireflection layer, a known organic EL display, or the like can be used.

(Effect of Improving Brightness of Blue Light)

In such an organic EL display device according to the embodiment of the present invention, the reason why the effect of improving an antireflection function, particularly, an antireflection function in a case of being observed in the oblique direction is suitably obtained as described above.

On the other hand, the effect of improving the brightness of blue light is obtained by the following operation.

Figure 2:
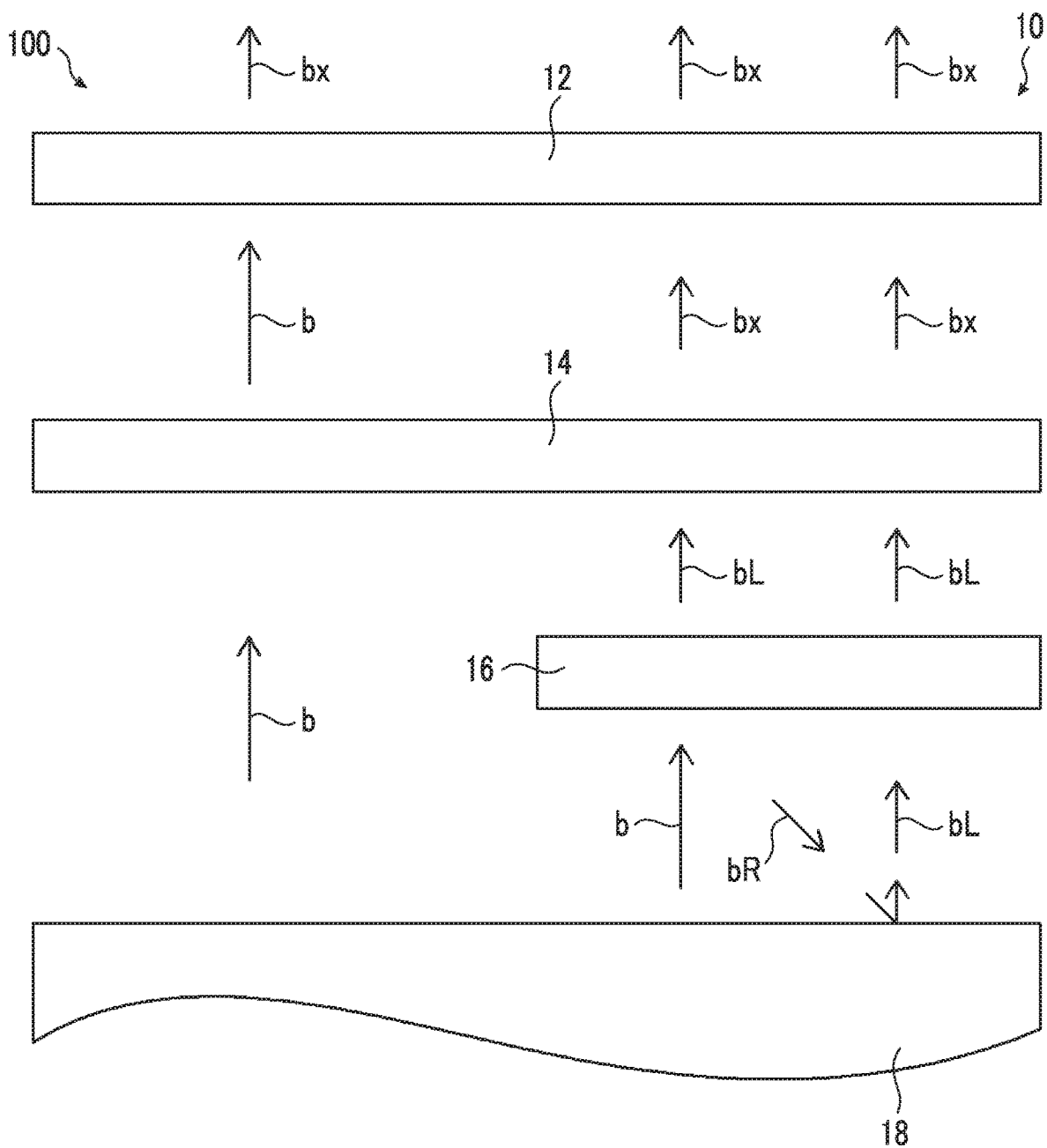
FIG. 2 is a conceptual view for describing the operation of the organic EL display device shown in FIG. 1.

FIG. 2 conceptually shows the organic EL display device 10 according to the embodiment of the present invention shown in FIG. 1 and an organic EL display device 100 of the related art in a disassembled state. As well known, the organic EL display device 100 of the related art also usually has a combination of the polarizer 12 and the phase difference layer 14 (λ/4 plate) as an antireflection layer.

In the organic EL display device 100 of the related art, blue light b emitted by the organic EL light emitting element 18 is first made incident into the phase difference layer 14, is transmitted without any effect, and is then made incident into the polarizer 11 In FIG. 2, the length of the arrow of the blue light h represents light intensity (amount of light).

Since the polarizer 12 allows only transmission of linearly polarized light in a predetermined direction (referred to as the x direction), linearly polarized light in a direction orthogonal to the x direction is blocked by the polarizer 12. Accordingly, the blue light b transmitted through the polarizer 12 is only half linearly polarized blue light bx in the x direction.

In contrast, in the organic EL display device 10 according to the embodiment of the present invention, first, the blue light b emitted by the organic EL light emitting element 18 is made incident into the circularly polarized light separating layer 16. As an example, in a case where the cholesteric liquid crystal layer of the circularly polarized light separating layer 16 is a layer which reflects right circularly polarized blue light bR, left circularly polarized blue light bL is transmitted and right circularly polarized blue light bR is reflected.

The left circularly polarized blue light bL transmitted through the circularly polarized light separating layer 16 is then made incident into the phase difference layer 14 (λ/4 plate), is transmitted, and then is converted into linearly polarized blue light bx in the x direction.

Next, the linearly polarized blue light bx is made incident into the polarizer 12. As described above, the polarizer 12 allows only transmission of linearly polarized light in the x direction. Accordingly, the linearly polarized blue light bx which is linearly polarized light in the x direction is transmitted through the polarizer 12 and is emitted.

On the other hand, the right circularly polarized blue light bR reflected by the circularly polarized light separating layer 16 is made incident into the organic EL light emitting element 18, is reflected, and is converted into left circularly polarized blue light bL.

Next, the left circularly polarized blue light bL reflected by the organic EL light emitting element 18 is made incident into the circularly polarized light separating layer 16. However, as described above, only right circularly polarized blue light bR is reflected, the left circularly polarized blue light bL is transmitted through the circularly polarized light separating layer 16.

After this, as described above, the left circularly polarized blue light bL is then converted by the phase difference layer 14 into linearly polarized blue light bx which is linearly polarized light in the x direction, is then transmitted through the polarizer 12, which allows only transmission of linearly polarized light in the x direction, and is emitted.

That is, in the organic EL display device 10 according to the embodiment of the present invention having the circularly polarized light separating layer 16, by adjusting the direction of the circularly polarized light reflected by the circularly polarized light separating layer 16, the slow axis of the phase difference layer 14, and the transmission axis of the polarizer 12 such that the direction of the linearly polarized light emitted by the phase difference layer 14 coincides with (substantially coincides with) the direction of the transmission axis of the polarizer 12, the amount of blue light about two times that of the organic EL display device of the related art can be emitted.

Accordingly, since the brightness of blue light about two times that of the organic EL display device of the related art can be emitted according to the organic EL display device 10 according to the embodiment of the present invention, an image display having high brightness can be obtained by improving the brightness of red light and green light together with blue light. In contrast, in a case where the display brightness may be the same as the display brightness of the organic EL display device of the related art, since the output of a blue light emitting source (organic EL light source for emitting blue light) can be reduced, the lifetime of the blue light emitting source can be extended and an organic EL display device 10 having high durability can be realized.

(C-Plate Additionally Used As Necessary)

In the organic EL display device according to the embodiment of the present invention, since the sum (total) of Rth(550) of the members having an optical function, which are provided between the polarizer 12 and the organic EL light emitting element 18, is set to −50 to 50 nm and an antireflection function, particularly, an antireflection function in the oblique direction is achieved, the C-plate 32 may be added as necessary as in the organic EL display device 30 conceptually shown in FIG. 3.

As described above, in the circularly polarized light separating layer 16 which is a cholesteric liquid crystal layer, as the number of spiral turns of the cholesteric liquid crystal layer increases, the reflectivity of blue light can increase and the brightness of blue light can increase.

In contrast, in a case where the number of spiral turns of the cholesteric liquid crystal layer increases (for example, in a case where the number of spiral turns is 6 or more), the absolute value of Rth(550) of the circularly polarized light separating layer 16 (cholesteric liquid crystal layer) increases and it becomes difficult to set the sum (total) of Rth(550) of the members having an optical function, which are provided between the polarizer 12 and the organic EL light emitting element 18, in combination with the phase difference layer 14 to be in a range of −50 to 50 nm in some cases.

On the other hand, according to the combination of the phase difference layer 14 and the circularly polarized light separating layer 16, by providing a −C-plate 32 of which Rth(550) has a positive value or a +C-plate 32 of which Rth(550) has a negative value between the polarizer 12 and the organic EL light emitting element 18, regardless of Rth(550) of the phase difference layer 14 and the circularly polarized light separating layer 16, the sum (total) of Rth (550) of the members having an optical function, which are provided between the polarizer 12 and the organic EL light emitting element 18, can be set to −50 to 50 nm.

As an example, as described above, in the case of using the phase difference layer 14 formed of the +A-plate having reciprocal wavelength dispersibility or the B-plate having reciprocal wavelength dispersibility, of which Rth(550) has a positive value, and the circularly polarized light separating layer 16 (cholesteric liquid crystal layer) that substantially functions as a +C-plate in the visible light range, has a negative Rth(550) value, and is formed of a disk-like liquid crystal compound, a −C-plate of which Rth(550) has a positive value is provided between the polarizer 12 and the organic EL light emitting element 18.

In addition, as described above, in the case of using the phase difference layer 14 formed of the −A-plate having forward wavelength dispersibility or the B-plate having forward wavelength dispersibility, of which Rth(550) has a negative value, and the circularly polarized light separating layer 16 that substantially functions as a −C-plate in the visible light range, has a positive Rth(550) value, and is formed of a rod-like liquid crystal compound, a +C-plate of which Rth(550) has a negative value is provided between the polarizer 12 and the organic EL light emitting element 18.

By using such a C-plate 32, the sum (total) of Rth(550) of members between the polarizer 12 and the organic EL light emitting element 18 can be adjusted with a high degree of freedom.

Therefore, by using the C-plate 32, the number of spiral turns of the circularly polarized light separating layer 16 (cholesteric liquid crystal layer) is increased, the reflectivity of blue light is improved by the circularly polarized light separating layer 16, the brightness of blue light is sufficiently increased, and then the absolute value of the sum (total) of Rth(550) of members having an optical function, which are provided between the polarizer 12 and the organic EL light emitting element 18 is made very small. Thus, an antireflection function in the oblique direction can also be enhanced.

That is, in the organic EL display device according to the embodiment of the present invention, in a case where there is no problem in the thickness of the organic EL display device, the complexity of the layer configuration between the polarizer 12 and the organic EL light emitting element 18, the cost, the productivity, and the like, from the viewpoint of performance, as in the organic EL display device 30 shown in FIG. 3, the configuration having the C-plate 32 is most advantageous.

In other words, from the viewpoints of the thickness of the organic EL display device, the simplicity of the layer configuration between the polarizer 12 and the organic EL light emitting element 18, the cost, the productivity, and the like, as in the organic EL display device 10 shown in FIG. 1, the configuration in which only the phase difference layer 14 and the circularly polarized light separating layer 16 are provided between the polarizer 12 and the organic EL light emitting element 18 is most advantageous.

Any known C-plate can be used as the C-plate 32. In addition, a commercially available optical film may be used as the C-plate 32.

The arrangement position of the C-plate 32 is preferably between the phase difference layer 14 and the circularly polarized light separating layer 16 or between the circularly polarized light separating layer 16 and the organic EL light emitting element 18. Further, Rth(550) of the C-plate 32 is not limited, but in order not to cause tinting due to a phase difference, it is preferable that the absolute value of Rth(550) of the C-plate 32 is 300 nm or less.

Further, the C-plate 32 may be used in combination of a plurality of the same C-plate 32 or different C-plates 32 as necessary.

EXAMPLES (Preparation of Polyethylene Terephthalate (PET) Film of Temporary Support)

A PET film (thickness: 75 μm) manufactured by Fujifilm Corporation was prepared. A rubbing treatment was performed on the PET film and this PET film was prepared as a temporary support. The direction of the rubbing treatment was set o be parallel to the longitudinal direction of the film.

In addition, it was confirmed that a normal PET film (for example, COSMOSHINE A4100, manufactured by Toyobo Co., Ltd.) could be used as a temporary support other than the above PET film.

(Glass Substrate)

A pressure sensitive adhesive (SK pressure sensitive adhesive, manufactured by Soken Chemical Co., Ltd.) was laminated on glass (EAGLE GLASS, manufactured by Corning Incorporated) to obtain a glass substrate.

(Preparation 1 of Coating Liquid for Blue Light Reflection Cholesteric Liquid Crystal Layer)

A coating liquid B1 for a cholesteric liquid crystal layer having the following composition was prepared.

| Coating Liquid B1 for Cholesteric Liquid Crystal Layer | |
|---|---:|
| Disk-like liquid crystal compound (Compound 101) | 80 parts by mass |
| Disk-like liquid crystal compound (Compound 102) | 20 parts by mass |
| Polymerizable monomer 1 | 10 parts by mass |
| Surfactant 1 | 0.3 parts by mass |
| Polymerization initiator 1 | 3 parts by mass |
| Chiral agent 1 | 5.04 parts by mass |
| Methyl ethyl ketone | 290 parts by mass |
| Cyclohexanone | 50 parts by mass |

[Chem. 1]

Compound 101

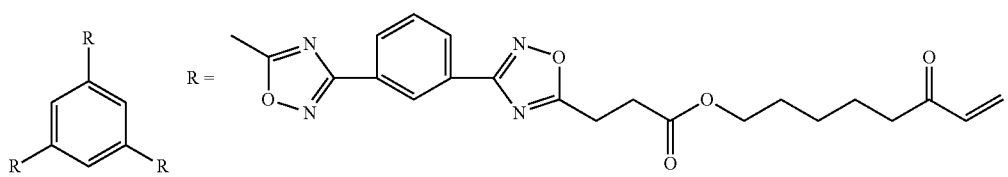

Compound 102

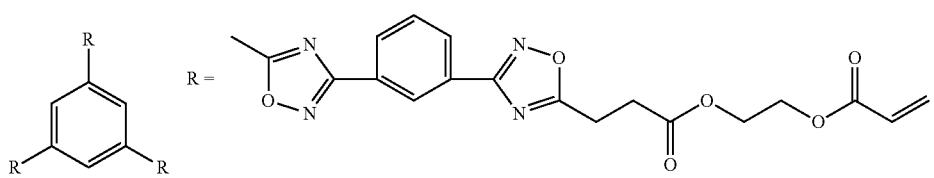

[Chem. 2]

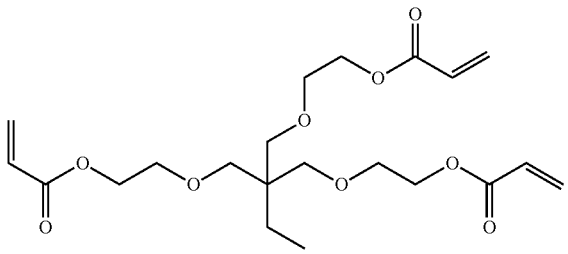

Polymerizable monomer 1

[Chem. 3]

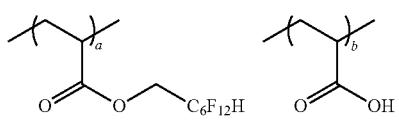

a/b = 98/2

[Chem. 4]

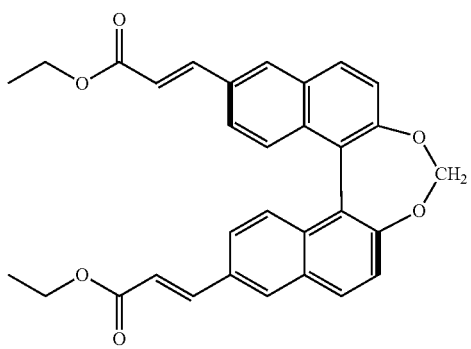

Chiral agent 1

(Preparation of Cholesteric Liquid Crystal Layer (Circularly Polarized Light Separating Layer) B1)

The coating liquid B1 for a cholesteric liquid crystal layer was applied to the rubbed surface of the PET film of the temporary support using a bar. Subsequently, after the coating film was dried at 70° C. for 2 minutes and the solvent was evaporated, heat aging was performed at 115° C. for 3 minutes to obtain a homogeneously aligned state. Thereafter, the coating film was retained at 45° C. and was subjected to ultraviolet irradiation (300 mJ/cm$^2$) under nitrogen atmosphere by using a high pressure mercury lamp to form a cholesteric liquid crystal layer B1 reflecting right circularly polarized blue light. As a result of observing the cross section of the cholesteric liquid crystal layer B1 with an SEM, the film thickness was 1.8 μm and the number of spiral turns of the cholesteric liquid crystal was 6 pitches.

Next, the prepared cholesteric liquid crystal layer B1 side was laminated on the pressure sensitive adhesive side of the glass substrate and the PET film of the temporary support was peeled off.

As a result of measuring the phase difference of the cholesteric liquid crystal layer B1 with AxoScan, it was found that Re(550)/Rth(550)=1 nm/−130 nm. In addition, the wavelength (selective reflection center wavelength) at which the transmittance for light in the normal direction is minimum was 450 nm, and the transmittance thereof was 53%.

Thus, it was confirmed that the cholesteric liquid crystal layer Bi reflected blue light and functioned as a +C-plate outside the reflection range.

(Preparation of Cholesteric Liquid Crystal Layers (Circularly Polarized Tight Separating Layers) B4, B5, and B7)

A cholesteric liquid crystal layer B4, a cholesteric liquid crystal layer B5, and a cholesteric liquid crystal layer B7 were respectively formed by forming each cholesteric liquid crystal layer on the PET film of the temporary support and transferring the formed cholesteric liquid crystal layer to the pressure sensitive adhesive side of the glass substrate in the same manner as in the preparation of the cholesteric liquid crystal layer B1 except that the film thickness of each cholesteric liquid crystal layer was set to 1.2 μm (B4), 1.5 μm (B5), and 2.3 μm (B7).

As a result of confirming the number of spiral turns of the cholesteric liquid crystal layer B4, the cholesteric liquid crystal layer B5, and the cholesteric liquid crystal layer B7 as in the case of the cholesteric liquid crystal layer B1, the number of spiral turns thereof was 4 pitches (B4), 5 pitches (B5), and 8 pitches (B7), respectively.

In addition, as a result of measuring the ratios Re(550)/Rth(550) of the cholesteric liquid crystal layer B4, the cholesteric liquid crystal layer B5, and the cholesteric liquid crystal layer B7 as in the case of the cholesteric liquid crystal layer B1, the ratios Re(550)/Rth(550) thereof were 1 nm/−85 nm (B4), 1 nm/−100 nm (B5), and 1 nm/−155 nm (B7), respectively.

Further, as a result of measuring the transmittances of the cholesteric liquid crystal layer B4, the cholesteric liquid crystal layer B5, and the cholesteric liquid crystal layer B7 at the selective reflection center wavelength (450 nm) as in the case of the cholesteric liquid crystal layer B1, the transmittances thereof were 64% (B4), 54% (B5), and 50% (B7), respectively.

Regarding the cholesteric liquid crystal layer B5, the half-width of selective reflection was measured using a spectrophotometer UV 3150 (manufactured by Shimadzu Corporation). As a result, the half-width of selective reflection was 60 nm.

(Preparation 2 of Coating Liquid for Blue Light Reflection Cholesteric Liquid Crystal Layer)

A coating liquid B2 for a blue light reflection cholesteric liquid crystal layer having the following composition was prepared.

| Coating Liquid B2 for Cholesteric Liquid Crystal Layer | |
|---|---|
| Mixture of rod-like liquid crystal compounds below | 100.0 parts by mass |
| IRGACURE (Registered Trademark) 819 (manufactured by BASF SE) | 10.0 parts by mass |
| Chiral agent having the following structure | 6.5 parts by mass |
| Surfactant having the following structure | 0.08 parts by mass |
| Methoxyethyl ketone | 145.0 parts by mass |

[Chem. 5]

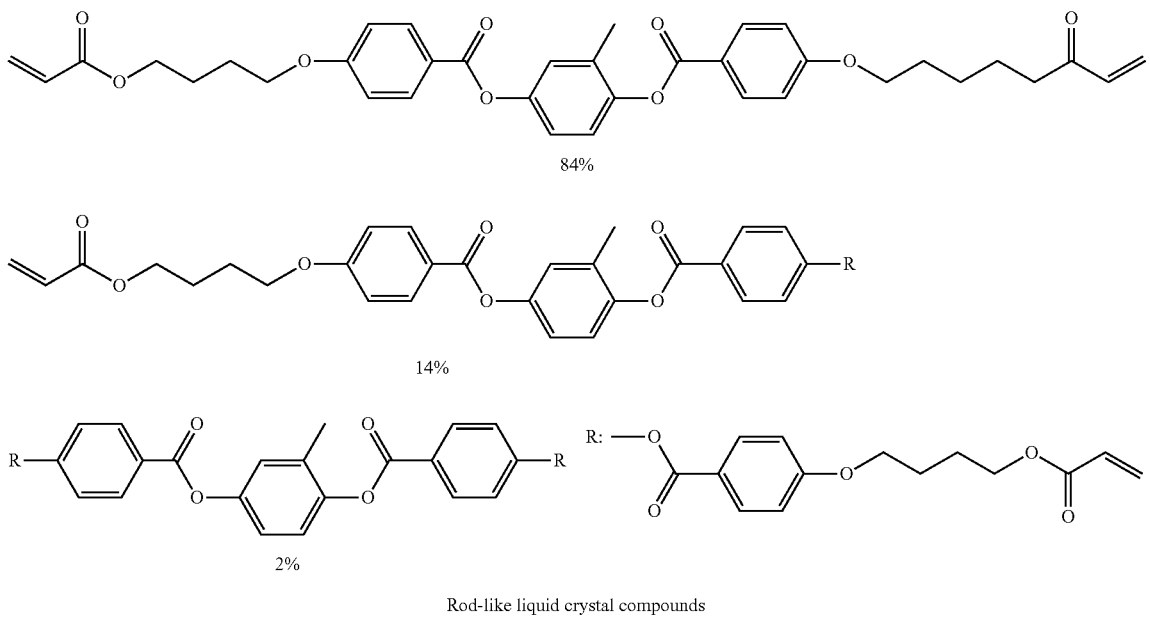

Rod-like liquid crystal compounds

[Chem. 6]

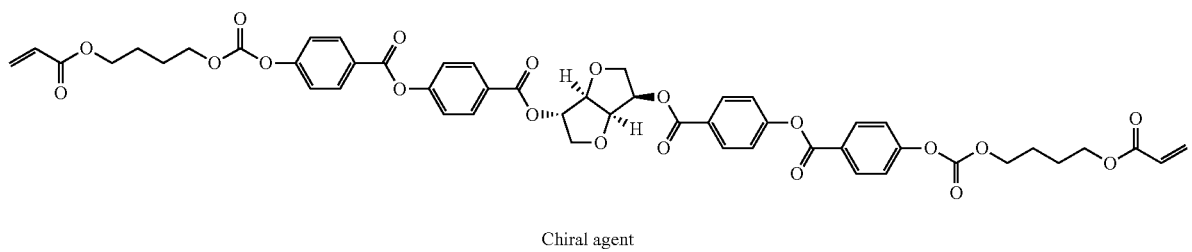

Chiral agent

[Chem. 7]

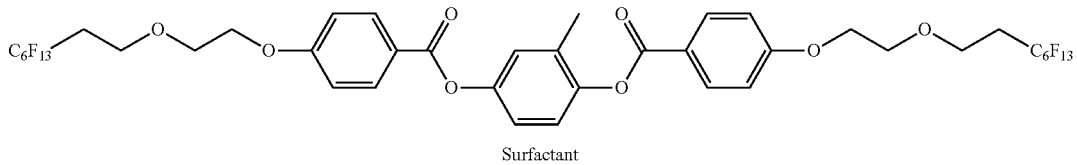

Surfactant (Preparation 2 of Cholesteric Liquid Crystal Layer B2 (Circularly Polarized Light Separating Layer))

The coating liquid B2 for a cholesteric liquid crystal layer was applied to the rubbed surface of the PET film of the temporary support using a bar. Subsequently, after the coating film was dried at 95° C. for 1 minute, the coating film was subjected to ultraviolet irradiation (500 mJ/cm$^2$) at 25° C. by using a high pressure mercury lamp to form a cholesteric liquid crystal layer B2 reflecting right circularly polarized blue light. As a result of observing the cross section of the cholesteric liquid crystal layer B2 with an SEM, the film thickness was 1.8 µm and the number of spiral turns of the cholesteric liquid crystal was 6 pitches.

Next, the prepared cholesteric liquid crystal layer B2 side was laminated on the pressure sensitive adhesive side of the glass substrate and the PET film of the temporary support was peeled off. As a result of measuring the phase difference of the cholesteric liquid crystal layer B2 with AxoScan, it was found that Re(550)/Rth(550)=1 nm/160 nm. In addition, the wavelength (selective reflection center wavelength) at which the transmittance for light in the normal direction is minimum was 450 nm, and the transmittance thereof was 53%.

Thus, it was confirmed that the cholesteric liquid crystal layer B2 reflected blue light and functioned as a –C-plate outside the reflection range.

(Preparation of Cholesteric Liquid Crystal Layers (Circularly Polarized Light Separating Layers) B3 and B6)

A cholesteric liquid crystal layer B3 and a cholesteric liquid crystal layer B6 were prepared by forming each cholesteric liquid crystal layer on the PET film of the temporary support and transferring the formed cholesteric liquid crystal layer to the pressure sensitive adhesive side of the glass substrate in the same manner as in the preparation of the cholesteric liquid crystal layer B2 except that the film thickness of each cholesteric liquid crystal layer was set to 1.2 µm (B3), and 2.4 µm (B6), respectively.

As a result of confirming the number of spiral turns of the cholesteric liquid crystal layer B3 and the cholesteric liquid crystal layer B6 as in the case of the cholesteric liquid crystal layer B2, the number of spiral turns thereof was 4 pitches (B3) and 8 pitches (B6), respectively.

(Preparation of Cholesteric Liquid Crystal Layer (Circularly Polarized Light Separating Layer) B8)

A cholesteric liquid crystal layer B8 was prepared by forming the cholesteric liquid crystal layer on the PET film of the temporary support and transferring the formed cholesteric liquid crystal layer to the pressure sensitive adhesive side of the glass substrate in the same manner as in the preparation of the cholesteric liquid crystal layer B1 except that in a case of ultraviolet irradiation (300 mJ/cm$^2$) under nitrogen atmosphere by using a high pressure mercury lamp, ultraviolet irradiation was performed while heating at 100° C. and the film thickness of the cholesteric liquid crystal layer was set to 1.5 µm (the same film thickness as that of B5). That is, the cholesteric liquid crystal layer B8 is a cholesteric liquid crystal layer prepared in the same manner as in the preparation of the cholesteric liquid crystal layer B5 except that heating was performed at the time of ultraviolet irradiation.

As a result of confirming the number of spiral turns of the cholesteric liquid crystal layer B8 as in the case of the cholesteric liquid crystal layer B1, the number of spiral turns was 5 pitches.

In addition, as a result of measuring the ratio Re(550)/Rth(550) of the cholesteric liquid crystal layer B8 as in the case of the cholesteric liquid crystal layer B1, the ratio Re(550)/Rth(550) was 1 nm/–100 nm.

Further, as a result of measuring the transmittance of the cholesteric liquid crystal layer B8 at the selective reflection center wavelength (450 nm) as in the case of the cholesteric liquid crystal layer B1, the transmittance thereof was 42%. In addition, as a result of measuring the half-width of selective reflection of the cholesteric liquid crystal layer B8 as in the case of the cholesteric liquid crystal layer B5, the half-width of selective reflection of the cholesteric liquid crystal layer B8 was 45 nm.

(Preparation 3 of Coating Liquid for Blue Light Reflection Cholesteric Liquid Crystal Layer)

A coating liquid B3 for a cholesteric liquid crystal layer was prepared by changing the mixture of the rod-like liquid crystal compounds ([Chem. 5]) in the coating liquid B2 for a blue light reflection cholesteric liquid crystal layer to a rod-like liquid crystal compound having the following structure.

[Chem. 8]

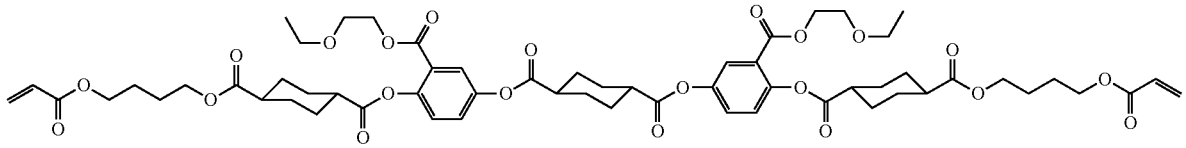

In addition, as a result of measuring the ratios Re(550)/Rth(550) of the cholesteric liquid crystal layer B3 and the cholesteric liquid crystal layer B6 as in the case of the cholesteric liquid crystal layer B2, the ratios Re(550)/Rth(550) thereof were 1 nm/110 nm (B3) and 1 nm/210 nm (B6), respectively.

Further, as a result of measuring the transmittances of the cholesteric liquid crystal layer B3 and the cholesteric liquid crystal layer B6 at the selective reflection center wavelength (450 nm) as in the case of the cholesteric liquid crystal layer B2, the transmittances thereof were 63% (B3) and 50% (B6), respectively.

(Preparation of Cholesteric Liquid Crystal Layer (Circularly Polarized Light Separating Layer) B9)

A cholesteric liquid crystal layer B9 reflecting right circularly polarized blue light was prepared by forming the cholesteric liquid crystal layer on the PET film of the temporary support and transferring the formed cholesteric liquid crystal layer to the pressure sensitive adhesive side of the glass substrate in the same manner as in the preparation of the cholesteric liquid crystal layer B1 except that the film thickness of the cholesteric liquid crystal layer was set to 3.0

μm and the coating liquid B1 for a cholesteric liquid crystal layer was changed to the coating liquid B3 for a cholesteric liquid crystal layer.

As a result of confirming the number of spiral turns of the cholesteric liquid crystal layer B9 as in the case of the cholesteric liquid crystal layer B1, the number of spiral turns was 5 pitches.

In addition, as a result of measuring the ratio Re(550)/Rth(550) of the cholesteric liquid crystal layer B9 as in the case of the cholesteric liquid crystal layer B1, the ratio Re(550)/Rth(550) was 1 nm/10 nm.

Further, as a result of measuring the transmittance of the cholesteric liquid crystal layer B9 at the selective reflection center wavelength (450 nm) as in the case of the cholesteric liquid crystal layer B1, the transmittance thereof was 42%. In addition, as a result of measuring the half-width of selective reflection of the cholesteric liquid crystal layer B9 as in the case of the cholesteric liquid crystal layer B5, the half-width of selective reflection of the cholesteric liquid crystal layer B9 was 30 nm.

(Preparation 1 of Phase Difference Layer)

A coating liquid 01 for an optically anisotropic layer having the following composition was prepared.

| Coating Liquid 01 for Optically Anisotropic Layer | |
|---|---|
| Liquid crystal compound L-3 below | 43.75 parts by mass |
| Liquid crystal compound L-4 below | 43.75 parts by mass |
| Polymerizable compound A-1 below | 12.50 parts by mass |
| Polymerization initiator S-1 (oxime type) below | 3.00 parts by mass |
| Leveling agent G-1 | 0.20 parts by mass |
| HISOLVE MTEM (manufactured by Toho Chemical Industry Co., Ltd.) | 2.00 parts by mass |
| NK ESTER A-200 (manufactured by Shin-Nakamura Chemical Co., Ltd.) | 1.00 part by mass |
| Methyl ethyl ketone | 424.8 parts by mass |

The group adjacent to the acryloyloxy group in the following liquid crystal compounds L-3 and L-4 represents a propylene group (a group in which a methyl group is substituted with an ethylene group), and the following liquid crystal compounds L-3 and L-4 each represent a mixture of positional isomers in which methyl group positions are different.

[Chem. 9]

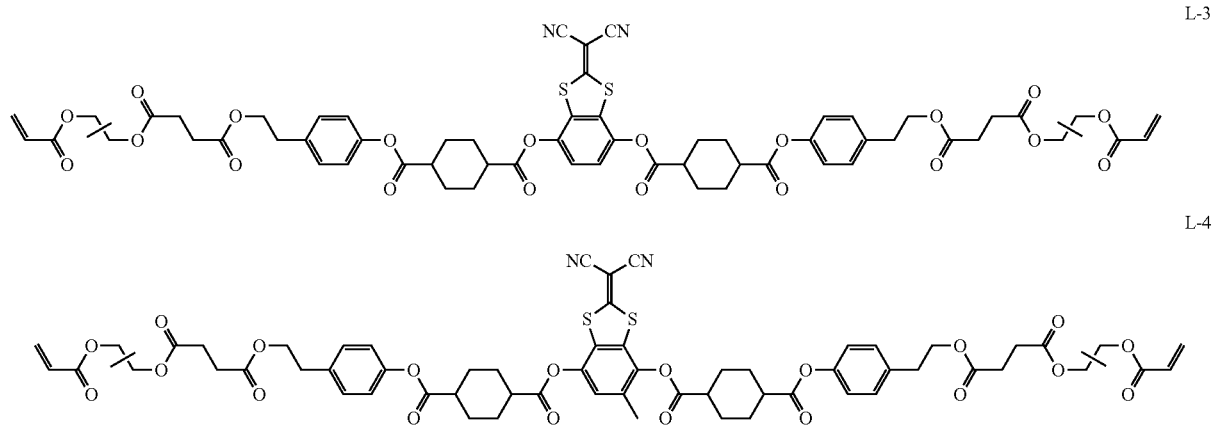

L-3

L-4

[Chem. 10]

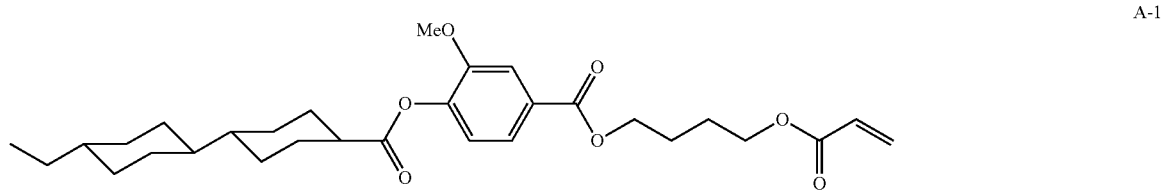

A-1

[Chem. 11]

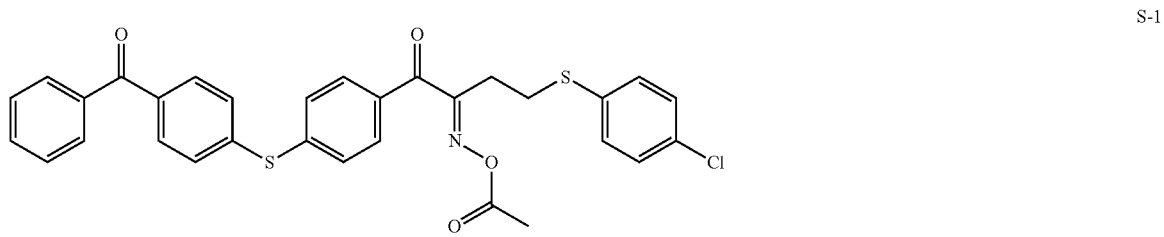

S-1

[Chem. 12]

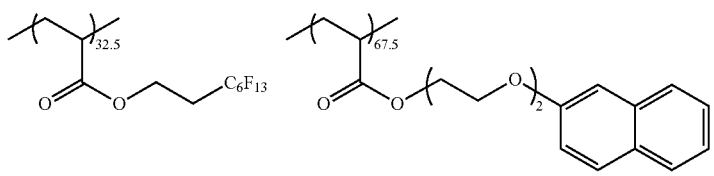

G-1

The coating liquid 01 for an optically anisotropic layer was applied to the rubbed surface of the PET film of the temporary support. Subsequently, after the coating film was dried at 90° C. for 2 minutes and the solvent was evaporated, heat aging was performed at 60° C. for 3 minutes to obtain a homogeneously aligned state. Then, the coating film was retained at 60° C. and was subjected to ultraviolet irradiation (500 mJ/cm2) under nitrogen atmosphere by using a high pressure mercury lamp to form an optically anisotropic layer 01 (phase difference layer) having a film thickness of 2.0 µm.

Next, the prepared optically anisotropic layer 01 was laminated on the pressure sensitive adhesive side of the glass substrate and the PET film of the temporary support was peeled off. As a result of measuring the phase difference of the optically anisotropic layer 01 with AxoScan, the following values were obtained. The measurement wavelengths used were 450 nm, 550 nm, and 650 nm.

|  | 450 nm | 550 nm | 650 nm |
|---|---|---|---|
| Re/Rth(nm) | 119/60 | 140/70 | 147/74 |

The above shows that Re and Rth at a wavelength of 450 nm were respectively 119 nm and 60 nm, Re and Rth at a wavelength of 550 nm were respectively 140 nm and 70 nm, and Re and Rth at a wavelength of 650 nm were respectively 147 nm and 74 nm.

Thus, it was confirmed that the optically anisotropic layer 01 was a λ/4 film of a +A-plate having reciprocal wavelength dispersibility. Hereinafter, the optically anisotropic layer 01 is referred to as a film 01.

(Preparation 2 of Phase Difference Layer)

A coating liquid 02 for an optically anisotropic layer having the following composition was prepared.

| Coating Liquid 02 for Optically Anisotropic Layer | |
|---|---|
| Disk-like liquid crystal compound (Compound 101 above) | 80 parts by mass |
| Disk-like liquid crystal compound (Compound 102 above) | 20 parts by mass |
| Alignment assistant agent 1 | 0.9 parts by mass |
| Alignment assistant agent 2 | 0.1 parts by mass |
| Surfactant 1 above | 0.3 parts by mass |
| Polymerization initiator 1 above | 3 parts by mass |
| Methyl ethyl ketone | 301 parts by mass |

[Chem. 13]

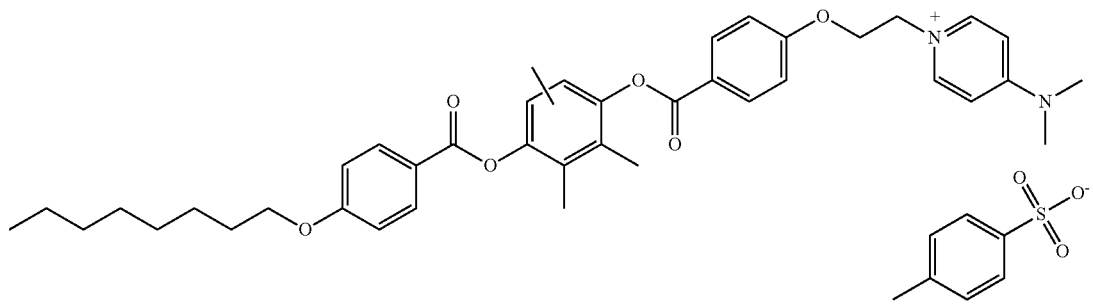

[Chem. 14]

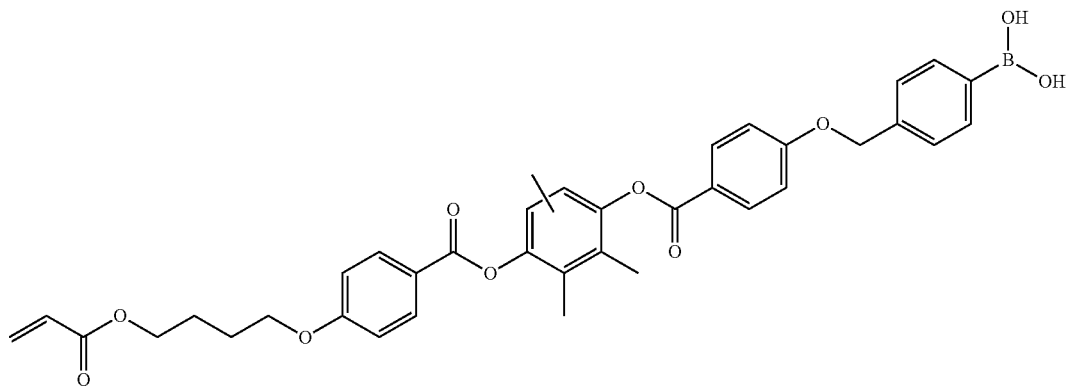

The coating liquid 02 for an optically anisotropic layer was applied to the rubbed surface of the PET film of the temporary support, Subsequently, after the coating film was dried at 130° C. for 90 seconds and the solvent was evaporated, the coating film was retained at 80° C. and was subjected to ultraviolet irradiation (300 mJ/cm2) by using a high pressure mercury lamp to prepare an optically anisotropic layer 02 (phase difference layer) having a film thickness of 1.0 μm.

Next, the prepared optically anisotropic layer 02 was laminated on the pressure sensitive adhesive side of the glass substrate and the PET film of the temporary support was peeled off. As a resulting of measuring the phase difference of the optically anisotropic layer 02 with AxoScan, the following values were obtained. The measurement wavelengths used were 450 nm, 550 nm, and 650 nm.

|  | 450 nm | 550 nm | 650 nm |
|---|---|---|---|
| Re/Rth(nm) | 154/−78 | 140/−70 | 134/−67 |

The above shows that Re and Rth at a wavelength of 450 nm were respectively 154 nm and −78 nm. Re and Rth at a wavelength of 550 nm were respectively 140 nm and −70 nm, and Re and Rth at a wavelength of 650 nm were respectively 134 nm and −67 nm.

Thus, it was confirmed that the optically anisotropic layer 02 was a λ/4 film of a −A-plate having forward wavelength dispersibility. Hereinafter, the optically anisotropic layer 02 is referred to as a λ/4 film 02.

(Preparation 3 of Phase Difference Layer)
<Preparation of Cellulose Acylate Solution>

The following raw materials were put into a mixing tank and were stirred and dissolved while being heated, thereby preparing a cellulose acylate solution.

| Cellulose acylate (total substitution degree of acyl group: 2.1) | 100 parts by mass |
|---|---|
| Methylene chloride (first solvent) | 402 parts by mass |
| Methanol (second solvent) | 60 parts by mass |
| Polyester additive A below | 5 parts by mass |
| Sugar ester additive B below | 3 parts by mass |

Polyester Additive A

TABLE 1

| | Molecular weight | Dicarboxylic acid units | | | | Glycol units | | | |
| | | Terephthalic acid (% by mol) | Phthalic acid (% by mol) | Adipic acid (% by mol) | Succinic acid (% by mol) | Ethylene glycol (% by mol) | 1,2-propane diol (% by mol) | PG ratio (%) | Terminal |
|---|---|---|---|---|---|---|---|---|---|
| Ester 1 | 800 | 55 | 0 | 0 | 45 | 50 | 50 | 50 | Ac |

(Ac Represents an Acetyl Group)
<Preparation of Cellulose Acylate Film>

The prepared cellulose acylate solution was filtered with filter paper having an absolute filtration accuracy of 0.01 mm. The temperature at the filtration was 40° C. Subsequently, the dope obtained through the filtration was east with a band casting machine. The film dried on the band casting machine was peeled off and was subjected to fixed end uniaxial stretching under the conditions of a temperature of 190° C. and a stretching ratio of 80%, thereby preparing a cellulose acylate film 01 having a film thickness of 45 μm.

As a result of measuring the phase difference of the prepared cellulose acylate film 01 with AxoScan, the following values were obtained. The measurement wavelengths used were 450 nm, 550 nm, and 650 nm.

|  | 450 nm | 550 nm | 650 nm |
|---|---|---|---|
| Re/Rth(nm) | 124/128 | 140/140 | 146/145 |

The above shows that Re and Rth at a wavelength of 450 nm were respectively 124 nm and 128 nm, Re and Rth at a wavelength of 550 nm were respectively 140 nm and 140 nm, and Re and Rth at a wavelength of 650 nm were respectively 146 nm and 145 nm.

Thus, it was confirmed that the cellulose acylate film 01 was a biaxial λ/4 film of a B-plate having a positive Rth value and reciprocal wavelength dispersibility. Hereinafter, the cellulose acylate film 01 was referred to as a λ/4 film 03.

(Preparation 4 of Phase Difference Layer)
<Preparation of Polystyrene Solution>

The following raw materials were put into a mixing tank and were stirred and dissolved while being heated, thereby preparing a polystyrene solution.

| Polystyrene PSJ-G9504 (manufactured by PS Japan Corporation) | 100 parts by mass |
|---|---|
| Methylene chloride | 233 parts by mass |

<Preparation of Polystyrene Film Sample>

The prepared solution was filtered with filter paper (#63, manufactured by Toys Filter Paper Co., Ltd.) having an absolute filtration accuracy of 10 μm and was further filtered with a sintered metal filter (FH025, manufactured by Pall Corporation) having an absolute filtration accuracy of 2.5 μm. Then, the polystyrene solution was applied to a glass substrate by a die coating method using a slot die described in Example 1 of JP2006-122889A and dried at 110° C. for 30 minutes.

Thereafter, the formed film was peeled off from the glass substrate and was subjected to fixed end uniaxial stretching under the conditions of a temperature of 105° C., a stretching

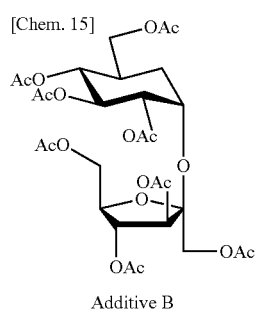

[Chem. 15]

Additive B ratio of 120%, and a stretching rate of 60%/min, thereby preparing a polystyrene film 01. having a film thickness of 27 µm.

As a result of measuring the phase difference of the prepared polystyrene film 01 with AxoScan, the following values were obtained. The measurement wavelengths used were 450 nm, 550 nm, and 650 nm.

|  | 450 nm | 550 nm | 650 nm |
|---|---|---|---|
| Re/Rth(nm) | 147/−122 | 140/−116 | 136/−113 |

The above shows that Re and Rth at a wavelength of 450 nm were respectively 147 nm and −122 am, Re and Rth at a wavelength of 550 nm were respectively 140 am and −116 nm, and Re and Rth at a wavelength of 650 nm were respectively 136 nm and −113 nm.

Thus, it was confirmed that the polystyrene film 01 was a biaxial λ/4 film of a B-plate having a negative Rth value and forward wavelength dispersibility. Hereinafter, the polystyrene film 01 was referred to as a λ/4 film 04.

(Preparation 5 of Phase Difference Layer)

A laminate film 01 (optical laminate) in which a cellulose acylate film, a λ/2 phase difference layer formed using a disk-like liquid crystal compound, and a λ/4 phase difference layer formed using a disk-like liquid crystal compound described in Example 14 of WO2013/137464A were laminated in this order was prepared.

As a result of measuring the phase difference of the laminate film 01 with KOBRA, the following values were obtained.

|  | 450 nm | 550 nm | 650 nm |
|---|---|---|---|
| Re/Rth(nm) | 109/−120 | 135/−148 | 147/−161 |

The above shows that Re and Rth at a wavelength of 450 nm were respectively 109 nm and −120 nm, Re and Rth at a wavelength of 550 nm were respectively 135 nm and −148 nm, and Re and Rth at a wavelength of 650 nm were respectively 147 nm and −161 nm.

Thus, it was confirmed that in a case where the laminate film 01 was considered as one film, the laminate film was a λ/4 film having a negative Rth value and reciprocal wavelength dispersibility. Hereinafter, the laminate film 01 is referred to as a λ/4 film 05.

(−C-Plate 01)

A TAC film (triacetyl cellulose film, FUJITACK TD80UL, manufactured by Fujifilm Corporation) was prepared.

As a result of measuring the phase difference of the TAC film with AxoScan, the following values were obtained. The measurement wavelengths used were 450 nm, 550 nm, and 650 nm.

|  | 450 nm | 550 nm | 650 nm |
|---|---|---|---|
| Re/Rth(nm) | 0/37 | 0/40 | 1/42 |

The above shows that Re and Rth at a wavelength of 450 nm were respectively 0 nm and 37 nm, Re and Rth at a wavelength of 550 nm were respectively 0 nm and 40 nm, and Re and Rth at a wavelength of 650 nm were respectively 1 nm and 42 nm.

Thus, it was confirmed that the TAC film was a −C-plate having a positive Rth value and reciprocal wavelength dispersibility. Hereinafter, the TAC film is referred to as a −C-plate 01.

(Preparation of +C-Plate 02)

An alignment film is formed on a cellulose triacetate film (Z-TAC, manufactured by Fujifilm Corporation) with reference to the description in the example of JP2013-222006A, and a composition for a phase difference layer was further applied to the alignment film to form an optically anisotropic layer 03. This layer is referred to as an optically anisotropic film 03.

As a result of measuring the phase difference of the optically anisotropic film 03 with. AxoScan, the following values were obtained. The measurement wavelengths used were 450 nm, 550 nm, and 650 nm.

|  | 450 nm | 550 nm | 650 nm |
|---|---|---|---|
| Re/Rth(nm) | 5/−81 | 3/−70 | 2/−67 |

The above shows that Re and Rth at a wavelength of 450 nm were respectively 5 nm and −81 nm, Re and Rth at a wavelength of 550 nm were respectively 3 nm and −70 nm, and Re and Rth at a wavelength of 650 nm were respectively 2 nm and −67 nm.

Thus, it was confirmed that the optically anisotropic film 03 was a +C-plate having forward wavelength dispersibility. Hereinafter, the optically anisotropic film 03 is referred to as a +C-plate 02.

(Preparation of +C-Plate 03)

An optically anisotropic layer 04 was formed in the same manner as in the formation of the optically anisotropic layer 03 except that the film thickness of the optically anisotropic layer was changed. This layer was referred to as an optically anisotropic film 04.

As a result of measuring the phase difference of the optically anisotropic film 04 with AxoScan, the following values were obtained. The measurement wavelengths used were 450 nm, 550 nm, and 650 nm.

|  | 450 nm | 550 nm | 650 nm |
|---|---|---|---|
| Re/Rth(nm) | 5/−162 | 3/−140 | 2/−134 |

The above shows that Re and Rth at a wavelength of 450 nm were respectively 5 nm and −1620 nm, Re and Rth at a wavelength of 550 nm were respectively 3 nm and −140 nm, and Re and Rth at a wavelength of 650 nm were respectively 2 nm and −134 nm.

Thus, it was confirmed that the optically anisotropic film 04 was a +C-plate having forward wavelength dispersibility. Hereinafter, the optically anisotropic film 04 is referred to as a +C-plate 03.

(Preparation of Polarizer 01)

A TAC film (triacetyl cellulose, FUJITACK TD80UL, manufactured by Fujifilm Corporation) was immersed in a 1.5 N aqueous sodium hydroxide solution at 55° C. for 2 minutes, was washed in a water bath at room temperature, and was neutralized using 0.1 N sulfuric acid at 30° C. Again, the obtained film was washed in a water-washing bath at room temperature and further dried with hot air of 100° C.

In addition, a roll-like polyvinyl alcohol film having a thickness of 80 μm was continuously stretched five times in an aqueous iodine solution and dried to obtain a polarizer 01 having a thickness of 20 μm.

The FUJITACK TD80UL was bonded to only one side of the polarizer 01 using a 3% aqueous solution of polyvinyl alcohol (PVA-117H, manufactured by Kuraray Co., Ltd.) as an adhesive to prepare one side polarizer 01. The degree of polarization was 99.97% and the single plate transmittance was 43%.

Here, the degree of polarization and the single plate transmittance were measured using a spectrophotometer (VAP-7070, manufactured by JASCO Corporation).

(Preparation of Laminate) <Laminate J1>

The $\lambda/4$ film 01, the −C-plate 01, and the cholesteric liquid crystal layer B1 were laminated on the polarizer side of the one side polarizer 01 in this order to obtain a laminate J1.

Each layer (film, C-plate) was laminated using a pressure sensitive adhesive (SK pressure sensitive adhesive, manufactured by Soken Chemical Co., Ltd.). Regarding this point, the same applies to the following laminates. This pressure sensitive adhesive is a substance having no refractive index anisotropy, and thus Rth is 0 nm.

<Laminate J2>

The $\lambda/4$ film 02, the +C-plate 02, and the cholesteric liquid crystal layer B2 were laminated on the polarizer side of the one side polarizer 01 in this order to obtain a laminate J2.

<Laminate H1>

Only the $\lambda/4$ film 01 was laminated on the polarizer side of the one side polarizer 01 to prepare a laminate H1.

<Laminate H2>

The $\lambda/4$ film 01 and the cholesteric liquid crystal layer B3 were laminated on the polarizer side of the one side polarizer 01 in this order to prepare a laminate H2.

<Laminate H3>

The $\lambda/4$ film 02 and the cholesteric liquid crystal layer B4 were laminated on the polarizer side of the one side polarizer 01 in this order to prepare a laminate H3.

<Laminate J3>

The $\lambda/4$ film 01 and the cholesteric liquid crystal layer B5 were laminated on the polarizer side of the one side polarizer 01 in this order to prepare a laminate J3.

<Laminate J4>

The $\lambda/4$ film 02 and the cholesteric liquid crystal layer B3 were laminated on the polarizer side of the one side polarizer 01 in this order to prepare a laminate J4.

<Laminate J5>

The $\lambda/4$ film 03 and the cholesteric liquid crystal layer B1 were laminated on the polarizer side of the one side polarizer 01 in this order to prepare a laminate <Laminate J6>

The $\lambda/4$ film 04 and the cholesteric liquid crystal layer B2 were laminated on the polarizer side of the one side polarizer 01 in this order to prepare a laminate J6.

<Laminate J7>

The $\lambda/4$ film 01, the −C-plate 01, the −C-plate 01, and the cholesteric liquid crystal layer B7 were laminated on the polarizer side of the one side polarizer 01 in this order to prepare a laminate J7.

<Laminate J8>

The $\lambda/4$ film 02, the +C-plate 03, arid the cholesteric liquid crystal layer B6 were laminated on the polarizer side of the one side polarizer 01 in this order to prepare a laminate J8.

<Laminate J9>

The $\lambda/4$ film 01, the cholesteric liquid crystal layer BS were laminated on the polarizer side of the one side polarizer 01 in this order to prepare a laminate J9. However, in this laminate, the intersecting angle formed between the transmission axis of the polarizer and the transmission axis of the $\lambda/4$ film 01 was set to 38° instead of 45°.

<Laminate J10>

The $\lambda/4$ film 01 and the cholesteric liquid crystal layer BS were laminated on the polarizer side of the one side polarizer 01 in this order to prepare a laminate J10. However, in this laminate, the intersecting angle formed between the transmission axis of the polarizer and the transmission axis of the $\lambda/4$ film 01 was set to 52° instead of 45°.

In all of the laminates other than the laminate J9 and the laminate J10, the intersecting angle formed between the transmission axis of the polarizer and the transmission axis of the $\lambda/4$ film was 45°.

<Laminate J11>

The $\lambda/4$ film 05 and the cholesteric liquid crystal layer B2 were laminated on the polarizer side of the one side polarizer 01 in this order to prepare a laminate J11. The $\lambda/4$ film 05 is a $\lambda/4$ film of a laminate in which a $\lambda/4$ phase difference layer and a $\lambda/2$ phase difference layer are laminated.

<Laminate J12>

The $\lambda/4$ film 01 and the cholesteric liquid crystal layer B8 were laminated on the polarizer side of the one side polarizer 01 in this order to prepare a laminate J12.

<Laminate J13>

The $\lambda/4$ film 05 and the cholesteric liquid crystal layer B3 were laminated on the polarizer side of the one side polarizer 01 in this order to prepare a laminate J13. The $\lambda/4$ film 05 is a $\lambda/4$ film of a laminate in which a $\lambda/4$ phase difference layer and a $\lambda/2$ phase difference layer are laminated.

(Preparation of Organic EL Display Device)

Galaxy S4 (manufactured by Samsung Electronics Co., Ltd.) was disassembled, the antireflection film laminated on the product was partially peeled off and the device was used as a light emitting element. Each of the prepared laminates was laminated on this light emitting element via a pressure sensitive adhesive, respectively. At this time, lamination was performed such that the Galaxy S4 was arranged on the cholesteric liquid crystal layer side of each polarizer or the $\lambda/4$ film side.

(Evaluation)

For the evaluation, the maximum light amount in a wavelength range of 430 to 470 nm when the organic EL display device was displayed in blue was measured in the normal direction of the organic EL display device (blue light amount). The evaluation was performed using a relative value with the maximum light amount of the product as 100.

In addition, regarding the reflectivity in the oblique direction, in a power-off state, the LED light source was made incident in a direction of 60 degrees with respect to the normal direction of the organic EL display device and the reflectivity [%] was obtained from the brightness value of light reflected in the −58 degree direction.

SR-3UL1 (manufactured by Topcon Corporation) was used to measure the reflectivity.

Regarding Example 3 (half-width: 60 nm), Example 12 (half-width: 45 nm), and Example 13 (half-width: 30 nm) in which the half-width of selective reflection of the circularly polarized light separating layer (cholesteric liquid crystal layer) was measured, the reflected glare (halo phenomenon) was evaluated.

The reflected glare was evaluated as follows.

(Evaluation of Reflected Glare)

In the power-off state, the white LED light source was made incident in the direction of 45° upward to the normal direction of the organic EL display device, and from the regular reflection direction, the blur (multiple images) of the reflection image of the white LED light source reflected on the surface of the organic EL display device was visually evaluated.

The evaluation standards are as follows, and A and B are levels at which there is no problem in practice.

A . . . There is no multiple image of the reflection image of the LED light source at all.

B . . . A plurality of multiple images of the reflection image of the LED light source were observed in a width of 0 mm or more and less than 1 mm from the regular reflection image.

C . . . A plurality of multiple images of the reflection image of the LED light source were observed in a width of 1 mm or more and less than 5 mm from the regular reflection image.

D . . . A plurality of multiple images of the reflection image of the LED light source were observed in a width of 5 mm or more and less than 10 mm from the regular reflection image.

E . . . A plurality of multiple images of the reflection image of the LED light source were observed at a distance of 10 mm or more from the regular reflection image.

As a result of the above evaluation, the evaluation of reflected glare of Example 3 was B, and the evaluation of reflected glare of Example 12 was A.

The details of the layer configuration and the evaluation results were shown in the following tables.

TABLE 2

| | | | Example 1 | Example 2 | Comparative Example 1 | Comparative Example 2 | Comparative Example 3 |
|---|---|---|---|---|---|---|---|
| Layer configuration | | Laminate Name | J1 | J2 | H1 | H2 | H3 |
| | | Polarizing plate | | | Polarizing plate 01 | | |
| | Phase difference layer | λ/4 film | 01 | 02 | 01 | 01 | 02 |
| | | Re/Rth [nm] | 140/70 | 140/−70 | 140/70 | 140/70 | 140/−70 |
| | | Optical properties | Uniaxial | Uniaxial | Uniaxial | Uniaxial | Uniaxial |
| | | Wavelength dispersibility | Reciprocal dispersibility | Forward dispersibility | Reciprocal dispersibility | Reciprocal dispersibility | Forward dispersibility |
| | C-plate | C-plate | −C-plate 01 | +C-plate 02 | | | |
| | | Re/Rth [nm] | 0/40 | 3/−70 | | | |
| | Circularly polarized light separating layer | Cholesteric liquid crystal layer | B1 | B2 | | B3 | B4 |
| | | Re/Rth [nm] Half-width [nm] | 1/−130 | 1/160 | | 1/110 | 1/−85 |
| | | Film thickness [μm]/number of turns | 1.8/6 | 1.8/6 | | 1.2/4 | 1.2/4 |
| | Light emitting layer | | | | Organic EL display device | | |
| | Total [nm] of Rth between light emitting layer and polarizing plate | | −20 | 20 | 70 | 180 | −155 |
| Evaluation | | Blue light amount | 125 | 125 | 100 | 115 | 115 |
| | | Reflectivity in oblique direction [%] | 2.5 | 2.8 | 3.5 | 20 | 18 |
| | | Reflected glare | | | | | |

| | | | Example 3 | Example 4 | Example 5 | Example 6 |
|---|---|---|---|---|---|---|
| Layer configuration | | Laminate | J3 | J4 | J5 | J6 |
| | | Polarizing plate | | Polarizing plate 01 | | |
| | Phase difference layer | λ/4 film | 01 | 02 | 03 | 04 |
| | | Re/Rth [nm] | 140/70 | 140/−70 | 140/140 | 140/−116 |
| | | Optical properties | Uniaxial | Uniaxial | Biaxial | Biaxial |
| | | Wavelength dispersibility | Reciprocal dispersibility | Forward dispersibility | Reciprocal dispersibility | Forward dispersibility |
| | C-plate | C-plate | | | | |
| | | Re/Rth [nm] | | | | |
| | Circularly polarized light separating layer | Cholesteric liquid crystal layer | B5 | B3 | B1 | B2 |
| | | Re/Rth [nm] Half-width [nm] | 1/−100 | 1/110 | 1/−130 | 1/160 |
| | | Film thickness [μm]/number of turns | 1.5/5 | 1.2/4 | 1.8/6 | 1.8/6 |
| | Light emitting layer | | | Organic EL display device | | |
| | Total [nm] of Rth between light emitting layer and polarizing plate | | −30 | 40 | 10 | 44 |
| Evaluation | | Blue light amount | 120 | 115 | 125 | 125 |
| | | Reflectivity in oblique direction [%] | 2.5 | 3.0 | 2.8 | 3.1 |
| | | Reflected glare | B | | | |

TABLE 3

|  |  |  | Example 7 | Example 8 |
|---|---|---|---|---|
| Layer configuration | Laminate | | J7 | J8 |
| | Polarizing plate | | Polarizing plate 01 | |
| | Phase difference layer | $\lambda/4$ film | 01 | 02 |
| | | Re/Rth [nm] | 140/70 | 140/−70 |
| | | Optical properties | Uniaxial | Uniaxial |
| | | Wavelength dispersibility | Reciprocal dispersibility | Forward dispersibility |
| | C-plate | C-plate | −C-plate 01 | +C-plate 03 |
| | | Re/Rth [nm] | 0/80 | 3/−140 |
| | Circularly polarized light separating layer | Cholesteric liquid crystal layer | B7 | B6 |
| | | Re/Rth [nm] | 1/−155 | 1/210 |
| | | Half-width [nm] | 2.3/8 | 2.4/8 |
| | | Film thickness [μm]/number of turns | | |
| | Light emitting layer | | Organic EL display device | |
| | Total [nm] of Rth between light emitting layer and polarizing plate | | −5 | 0 |
| Evaluation | Blue light amount | | 130 | 130 |
| | Reflectivity in oblique direction [%] | | 2.3 | 2.3 |
| | Reflected glare | | | |

|  |  |  | Example 9 | Example 10 | Example 11 | Example 12 | Example 13 |
|---|---|---|---|---|---|---|---|
| Layer configuration | Laminate | | J9 | J10 | J11 | J12 | J13 |
| | Polarizing plate | | Polarizing plate 01 | | | | |
| | Phase difference layer | $\lambda/4$ film | 01 | 01 | 05 | 01 | 05 |
| | | Re/Rth [nm] | 140/70 | 140/70 | 135/−148 | 140/70 | 135/−148 |
| | | Optical properties | Uniaxial | Uniaxial | — | Uniaxial | — |
| | | Wavelength dispersibility | Reciprocal dispersibility | Reciprocal dispersibility | Reciprocal dispersibility | Reciprocal dispersibility | Reciprocal dispersibility |
| | C-plate | C-plate | | | | | |
| | | Re/Rth [nm] | | | | | |
| | Circularly polarized light separating layer | Cholesteric liquid crystal layer | B5 | B5 | B2 | B8 | B9 |
| | | Re/Rth [nm] | 1/−100 | 1/−100 | 1/160 | 1/−100 | 1/110 |
| | | Half-width [nm] | | | | 45 | 30 |
| | | Film thickness [μm]/number of turns | 1.5/5 | 1.5/5 | 1.8/6 | 1.5/5 | 3.0/5 |
| | Light emitting layer | | Organic EL display device | | | | |
| | Total [nm] of Rth between light emitting layer and polarizing plate | | −30 | −30 | 12 | −30 | −38 |
| Evaluation | Blue light amount | | 120 | 120 | 120 | 115 | 115 |
| | Reflectivity in oblique direction [%] | | 4.4 | 4.5 | 2.5 | 2.3 | 2.2 |
| | Reflected glare | | | | | A | A |

Example 7 is provided with two −C-plates 01.
The $\lambda/4$ film in Examples 11 and 13 is a laminate of a $\lambda/4$ phase difference layer and a $\lambda/2$ phase difference layer.

Thus, according to the organic EL display device according to the embodiment of the present invention, it could be confirmed that the brightness of blue light was improved and the reflectivity in the oblique direction could also be suppressed.

Particularly, as shown in Examples 1 and 2, and Examples 7 and 8, by using the C-plate in combination, the number of spiral turns of the cholesteric liquid crystal in the circularly polarized light separating layer as the cholesteric liquid crystal layer was increased, and Rth(550) of the members between the polarizing plate and the light emitting element was suitably adjusted, and thus an organic EL display device in which the brightness of blue light is high and reflection in the oblique direction is further prevented was obtained. In addition, as shown in Examples 5 and 6, by using the B-plate as a $\lambda/4$ film (phase difference layer), an organic EL display device in which the brightness of blue light is high was also obtained.

In addition, as shown in Example 11, even in a case where the $\lambda/4$ film (phase difference layer) is a lamination type, a good blue light brightness improving effect and suppression in reflection in the oblique direction can be obtained. Further, as shown in Examples 12 and 13, by narrowing the half-width of selective reflection of the circularly polarized light separating layer (cholesteric liquid crystal layer), the reflected glare can be suppressed.

As shown in Examples 9 and 10, in the present invention, even in a case where the intersecting angle formed between the transmission axis of the polarizing plate and the slow axis of the $\lambda/4$ film was outside the range of 45°±1°, a good blue light brightness improving effect and suppression in reflection in the oblique direction can be obtained.

The present invention can be used for various applications as a display device.

EXPLANATION OF REFERENCES 10, 30, 100: organic EL display device
12: polarizer
14: phase difference layer
16: circularly polarized light separating layer
18: organic EL light emitting element
b: blue light
bx: linearly polarized blue light bL: left circularly polarized blue light
bR: right circularly polarized blue light

What is claimed is:

1. An organic electroluminescence display device comprising, at least:
   a polarizer;
   a phase difference layer;
   a circularly polarized light separating layer; and
   an organic electroluminescence light emitting element,
   wherein the polarizer, the phase difference layer, the circularly polarized light separating layer, and the organic electroluminescence light emitting element are arranged in this order from a viewing side,
   wherein an in-plane retardation Re(550) of the phase difference layer is 100 to 160 nm, the circularly polarized light separating layer is a cholesteric liquid crystal layer having a selective reflection center wavelength in a range of 425 to 475 nm,
   wherein a sum of retardations Rth(550) in a thickness direction of members having an optical function, which are arranged between the polarizer and the organic electroluminescence light emitting element, is −50 to 50 nm, and
   wherein the phase difference layer exhibits reciprocal wavelength dispersibility.

2. The organic electroluminescence display device according to claim 1,
   wherein the number of spiral turns of the cholesteric liquid crystal layer is 4 to 8.

3. The organic electroluminescence display device according to claim 1, further comprising:
   a C-plate arranged between the polarizer and the organic electroluminescence light emitting element,
   wherein the number of spiral turns of the cholesteric liquid crystal layer is 6 to 8.

4. The organic electroluminescence display device according to claim 1,
   wherein the phase difference layer is an A-plate, and
   the number of spiral turns of the cholesteric liquid crystal layer is 4 or 5.

5. The organic electroluminescence display device according to claim 1,
   wherein the phase difference layer is a B-plate, and
   the number of spiral turns of the cholesteric liquid crystal layer is 6 to 8.

6. The organic electroluminescence display device according to claim 1,
   wherein the circularly polarized light separating layer is a cholesteric liquid crystal layer formed of a disk-like liquid crystal compound.

7. The organic electroluminescence display device according to claim 1,
   wherein the circularly polarized light separating layer is a cholesteric liquid crystal layer formed of a rod-like liquid crystal compound.

8. The organic electroluminescence display device according to claim 1,
   wherein the sum of retardations Rth(550) in a thickness direction of members having an optical function, which are arranged between the polarizer and the organic electroluminescence light emitting element, is −40 to 40 nm.

* * * * *